(12) United States Patent
Sasaki

(10) Patent No.: US 10,980,157 B2
(45) Date of Patent: Apr. 13, 2021

(54) INFORMATION PROCESSING APPARATUS AND INFORMATION PROCESSING SYSTEM

(71) Applicant: FUJITSU LIMITED, Kawasaki (JP)

(72) Inventor: Takayuki Sasaki, Yokosuka (JP)

(73) Assignee: FUJITSU LIMITED, Kawasaki (JP)

(*) Notice: Subject to any disclaimer, the term of this patent is extended or adjusted under 35 U.S.C. 154(b) by 322 days.

(21) Appl. No.: 16/114,280

(22) Filed: Aug. 28, 2018

(65) Prior Publication Data
US 2019/0069447 A1 Feb. 28, 2019

(30) Foreign Application Priority Data
Aug. 30, 2017 (JP) .............................. JP2017-165361

(51) Int. Cl.
*H05K 7/20* (2006.01)
*G05B 23/02* (2006.01)
*G05B 15/02* (2006.01)
*G06F 1/20* (2006.01)

(52) U.S. Cl.
CPC ......... *H05K 7/20763* (2013.01); *G05B 15/02* (2013.01); *G05B 23/0272* (2013.01); *H05K 7/20836* (2013.01); *G06F 1/20* (2013.01); *G06F 1/206* (2013.01)

(58) Field of Classification Search
USPC .......................................................... 702/1
See application file for complete search history.

(56) References Cited

U.S. PATENT DOCUMENTS

| | | | | |
|---|---|---|---|---|
| 2014/0060773 | A1* | 3/2014 | Wajima | G06F 1/00 165/11.1 |
| 2015/0234439 | A1 | 8/2015 | Miyazaki | |
| 2018/0300214 | A1* | 10/2018 | Wang | G06F 11/0709 |
| 2019/0044372 | A1* | 2/2019 | Cochran | H05K 7/20781 |

FOREIGN PATENT DOCUMENTS

| | | |
|---|---|---|
| JP | 2015-53004 | 3/2015 |
| JP | 2015-156102 | 8/2015 |

* cited by examiner

*Primary Examiner* — Paul D Lee
(74) *Attorney, Agent, or Firm* — Fujitsu Patent Center

(57) ABSTRACT

There is provided an information processing apparatus among a plurality of information processing apparatuses included within an information processing system, the information processing apparatus including a memory, a processor coupled to the memory and configured to perform information processing, and a controller configured to acquire a plurality of sensor data items output from each a plurality of sensors arranged in a liquid cooling system cooling the plurality of information processing apparatuses and abnormality information relating to the liquid cooling system stored by another information processing apparatus among the plurality of information processing apparatuses, detect an abnormality of the liquid cooling system based on the acquired sensor data items and the abnormality information, obtain a range of influence of the detected abnormality of the liquid cooling system based on the detected abnormality, and control the information processing apparatus based on the range of influence.

8 Claims, 21 Drawing Sheets

| ABNORMALITY | TEMPERATURE SENSOR | ROTATION SPEED SENSOR |
|---|---|---|
| LIQUID LEAKAGE | ON | ON |
| FAILURE OF COOLING FACILITY | ON | OFF |
| FAILURE OF PUMP | ON | ON |
| INSUFFICIENT FLOW RATE OF PIPE | ON | OFF |

FIG. 6

| REGISTER | R1 | R2 | R3 | R4 | R5 | R6 | R7 |
|---|---|---|---|---|---|---|---|
| SENSOR | S1 | S2 | S3 | S4 | S5 | S6 | S7 |
| LIQUID LEAKAGE | ON | ON | OFF | ON | OFF | ON | ON |
| FAILURE OF COOLING FACILITY | ON | OFF | ON | OFF | ON | OFF | OFF |
| FAILURE OF PUMP | ON | OFF | OFF | ON | OFF | ON | ON |
| INSUFFICIENT FLOW RATE IN PIPE | ON | OFF | OFF | ON | OFF | ON | OFF |

FIG. 7

| REGISTER | R8 | R9 | R10 | R11 |
|---|---|---|---|---|
| CONTENT | POSITION INFORMATION ON OWN SERVER | ABNORMALITY INFORMATION ON OWN SERVER | POSITION INFORMATION ON ANOTHER SERVER | ABNORMALITY INFORMATION ON ANOTHER SERVER |
| VALUE | NULL<br>U NUMBER | NULL: NO ABNORMALITY<br>1: LIQUID LEAKAGE<br>2: FAILURE OF COOLING FACILITY<br>3: FAILURE OF PUMP<br>4: INSUFFICIENT FLOW RATE IN PIPE | NULL<br>U NUMBER | NULL: NO ABNORMALITY<br>1: LIQUID LEAKAGE<br>2: FAILURE OF COOLING FACILITY<br>3: FAILURE OF PUMP<br>4: INSUFFICIENT FLOW RATE IN PIPE |

FIG. 8

| REGISTER | R8 | R9 | R10 | R11 |
|---|---|---|---|---|
| VALUE | 3 | NULL | 2 | 1 |

FIG. 12

| REGISTER | R8 | R9 | R10 | R11 | R12 | R13 |
|---|---|---|---|---|---|---|
| CONTENT | POSITION INFORMATION ON OWN SERVER | ABNORMALITY INFORMATION ON OWN SERVER | POSITION INFORMATION ON ANOTHER SERVER | ABNORMALITY INFORMATION ON ANOTHER SERVER | ID OF HEAT EXCHANGER CONNECTED TO OWN SERVER | ID OF HEAT EXCHANGER CONNECTED TO ANOTHER SERVER |
| VALUE | NULL<br>U NUMBER | NULL: NO ABNORMALITY<br>1: LIQUID LEAKAGE<br>2: FAILURE OF COOLING FACILITY<br>3: FAILURE OF PUMP<br>4: INSUFFICIENT FLOW RATE IN PIPE | NULL<br>U NUMBER | NULL: NO ABNORMALITY<br>1: LIQUID LEAKAGE<br>2: FAILURE OF COOLING FACILITY<br>3: FAILURE OF PUMP<br>4: INSUFFICIENT FLOW RATE IN PIPE | SERIAL NUMBER | SERIAL NUMBER |

FIG. 16

| REGISTER | R8 | R9 | R10 | R11 | R12 | R13 | R14 | R15 |
|---|---|---|---|---|---|---|---|---|
| CONTENT | POSITION INFORMATION ON OWN SERVER | ABNORMALITY INFORMATION ON OWN SERVER | POSITION INFORMATION ON ANOTHER SERVER | ABNORMALITY INFORMATION ON ANOTHER SERVER | ID OF HEAT EXCHANGER CONNECTED TO OWN SERVER | ID OF HEAT EXCHANGER CONNECTED TO ANOTHER SERVER | ID OF CASE OF OWN SERVER | ID OF CASE OF ANOTHER SERVER |
| VALUE | NULL U NUMBER | NULL: NO ABNORMALITY 1: LIQUID LEAKAGE 2: FAILURE OF COOLING FACILITY 3: FAILURE OF PUMP 4: INSUFFICIENT FLOW RATE IN PIPE | NULL U NUMBER | NULL: NO ABNORMALITY 1: LIQUID LEAKAGE 2: FAILURE OF COOLING FACILITY 3: FAILURE OF PUMP 4: INSUFFICIENT FLOW RATE IN PIPE | SERIAL NUMBER | SERIAL NUMBER | SERIAL NUMBER | SERIAL NUMBER |

FIG. 19

| | ABNORMALITY INFORMATION | TYPE OF ABNORMALITY |
|---|---|---|
| PRIORITY 1 | 2 | FAILURE OF COOLING FACILITY |
| PRIORITY 2 | 4 | INSUFFICIENT FLOW RATE IN PIPE |
| PRIORITY 3 | 1 | LIQUID LEAKAGE |
| PRIORITY 4 | 3 | FAILURE OF PUMP |

US 10,980,157 B2

INFORMATION PROCESSING APPARATUS AND INFORMATION PROCESSING SYSTEM

CROSS-REFERENCE TO RELATED APPLICATION

This application is based upon and claims the benefit of priority of the prior Japanese Patent Application No. 2017-165361, filed on Aug. 30, 2017, the entire contents of which are incorporated herein by reference.

FIELD

The embodiment discussed herein is related to an information processing apparatus and an information processing system.

BACKGROUND

A liquid cooling technology in a server (x86 server) adopting an x86 based central processing unit (CPU) and an architecture is also applied to a supercomputer system in a high-performance computing (HPC) field.

FIG. 1 illustrates an example of a cooling system combined with a liquid cooling technology in the related art and an air cooling technology. A heat exchanger 102 is provided on an information technology (IT) device side including a server 101, and an air conditioning device 103 and a cooling facility 104 are provided on a facility side. The cooling facility 104 is a cooling tower, a chiller, or the like. A fan 111 and a pump 112 are provided in the server 101 and a pump 113 and a blower 114 are provided in the cooling facility 104.

Heat discharged from a CPU, a memory, and the like, which are main heat generating components in the server 101 is transferred to the heat exchanger 102 by the secondary side cooling water circulated by the pump 112. The heat exchanger 102 cools the secondary side cooling water by performing heat exchange between the secondary side cooling water and the primary side cooling water circulated by pump 113. The cooling facility 104 cools the primary side cooling water by taking outside air by the blower 114.

Meanwhile, other components such as a hard disk drive (HDD) in the server 101 are cooled by air from the fan 111 and the air conditioning device 103. For example, the proportion of waste heat cooled by liquid cooling is approximately 80%, and the proportion of waste heat cooled by air cooling is approximately 20%.

There are also known an information processing system that detects the states of a plurality of information processing apparatuses of other cases by a plurality of information processing apparatuses of an own case and shuts down a power supply, and a system that shuts down a server when water droplets are detected (for example, see Japanese Laid-open Patent Publication No. 2015-156102 and Japanese Laid-open Patent Publication No. 2015-53004).

SUMMARY

According to an aspect of the invention, an information processing apparatus among a plurality of information processing apparatuses included within an information processing system, the information processing apparatus includes a memory, a processor coupled to the memory and configured to perform information processing, and a controller configured to acquire a plurality of sensor data items output from each a plurality of sensors arranged in a liquid cooling system cooling the plurality of information processing apparatuses and abnormality information relating to the liquid cooling system stored by another information processing apparatus among the plurality of information processing apparatuses, detect an abnormality of the liquid cooling system based on the acquired sensor data items and the abnormality information, obtain a range of influence of the detected abnormality of the liquid cooling system based on the detected abnormality, and control the information processing apparatus based on the range of influence.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram illustrating a register R1 to a register R7;
FIG. 7 is a diagram illustrating a register R8 to a register R11;
FIG. 8 is a diagram illustrating values of the register R8 to the register R11;
FIG. 12 is a diagram illustrating the register R8 to the register R13;
FIG. 16 is a diagram illustrating the register R8 to the register R15;
FIG. 19 is a diagram illustrating a priority table.

DESCRIPTION OF EMBODIMENT

In a case where introducing a platform of a supercomputer system is introduced to an information processing system for enterprise use, an operation of the information processing system may be stopped due to an abnormality of a liquid cooling system, and it may become difficult to continue service. Such a problem occurs not only in the information processing system for enterprise use but also in other information processing systems cooled by a liquid cooling system.

Hereinafter, embodiments of a technology for controlling an information processing apparatus according to an influence range of an abnormality of the liquid cooling system will be described in detail with reference to the drawings.

In the information processing system such as the supercomputer system, an information process is stopped when an abnormality occurs and an operation for restarting the information process is performed after completion of maintenance work, in many cases. Therefore, since there is a strong demand for realization of a lower price than that of detailed abnormality analysis, such an information processing system does not have a high reliability function and a hardware monitoring function such as the information processing system for enterprise use.

However, recently, in a field of artificial intelligence, big data analysis, or the like, there is a trend to expand a computing capacity based on highly parallel processing of the supercomputer system for enterprise use. Therefore, in the future, a business entity that provides end users with services such as the artificial intelligence and the big data analysis may introduce the supercomputer system platform and a cooling technology to the information processing system. In enterprise applications, it is desirable that the information processing system have a high reliability function and a hardware monitoring function because it provides a service to the end user.

For example, by providing a baseboard management controller (BMC) in a server, it is possible to perform management and monitoring of hardware of the server. In addition, a temperature sensor in the server can measure the temperature of the CPU and the rotation speed sensor in the server can measure the rotation speed of the cooling water pump. In this case, the BMC detects an abnormality (malfunction) of the liquid cooling system from sensor data output from the temperature sensor and the rotation speed sensor.

Figures 2, 3:
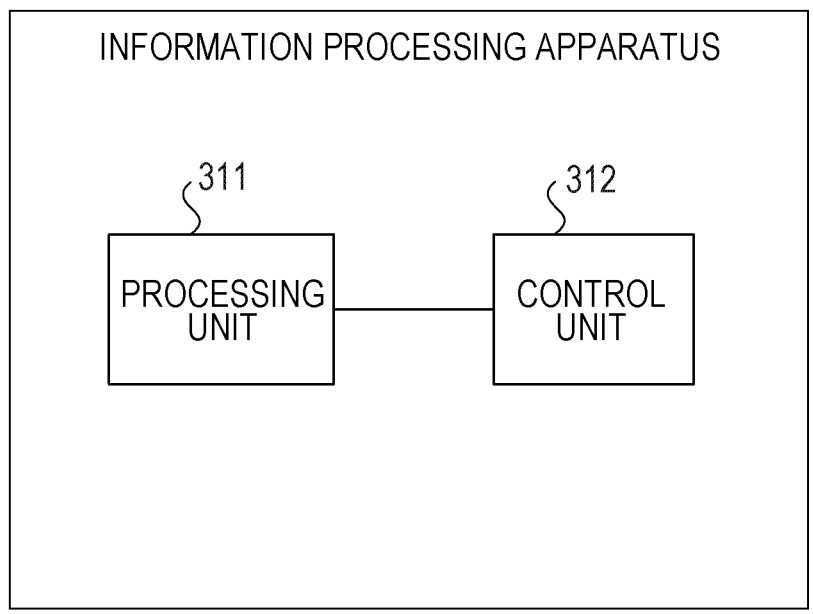
FIG. 2 is a diagram illustrating types of sensor data and an abnormality.
FIG. 3 is a functional configuration diagram of an information processing apparatus.

FIG. 2 illustrates an example of types of abnormality of the sensor data output from the temperature sensor and the rotation speed sensor and the liquid cooling system. Liquid leakage indicates liquid leakage from a pipe disposed in the server, and failure of a cooling facility indicates failure of a cooling tower, a chiller, or the like. The failure of pump indicates the failure of pump provided in the pipe and insufficient flow in the pipe indicates that the flow rate of cooling water is insufficient due to the clogging of pipe or the like.

The sensor data of the temperature sensor and the rotation speed sensor is an error flag indicating "ON" or "OFF", "ON" indicates that a value measured by a sensor is an abnormality value, and "OFF" indicates that the value measured by the sensor is a normal value.

In a case where the liquid leakage occurs, the temperature sensor and the rotation speed sensor output "ON", and in a case where the failure of the cooling facility occurs, the temperature sensor outputs "ON" and the rotation speed sensor outputs "OFF". In a case where the failure of pump occurs, the temperature sensor and the rotation speed sensor output "ON", and in a case where insufficient flow in a pipe occurs, the temperature sensor outputs "ON" and the rotation speed sensor outputs "OFF".

However, it is hard to distinguish the liquid leakage and the failure of pump with only sensor data of the temperature sensor and the rotation speed sensor, and it is also hard to distinguish the failure of the cooling facility and the insufficient flow in the pipe. Therefore, even if the BMC detects the occurrence of an abnormality in the liquid cooling system, since a type of the abnormality is unknown, it is hard to determine whether or not it is affected by the abnormality generated from a monitoring target server. Then, in a case where the temperature sensor or the rotation speed sensor outputs "ON", the BMC is forced to stop an operation of the server by assuming that the monitoring target server is affected by the abnormality.

Furthermore, in a case where multiple servers are mounted in one rack, when the BMC of one of the servers detects the abnormality in the liquid cooling system, the BMC eventually stops the operation of all the servers in the rack. When all the servers are stopped at the same time, it becomes hard to continue to provide a service to an end user, and the high reliability function may be impaired.

In order to specify a type of the abnormality in the liquid cooling system, it is conceivable to install a management server or the like. However, since the number of the servers mounted in the supercomputer system is hundreds of units to one thousand units and the sensor data such as the temperature sensor dynamically changes in units of several ms, it is not practical to monitor those sensor data with the management server. Therefore, it is desirable to specify a type of the abnormality in the liquid cooling system by the BMC in each server.

FIG. 3 illustrates a configuration diagram of the information processing apparatus of an embodiment. An information processing apparatus 301 of FIG. 3 is one information processing apparatus among a plurality of the information processing apparatuses included in the information processing system, and includes a processing unit 311 that performs the information process and a control unit 312 that controls the processing unit 311. These information processing apparatuses are cooled by the liquid cooling system.

Figure 4:
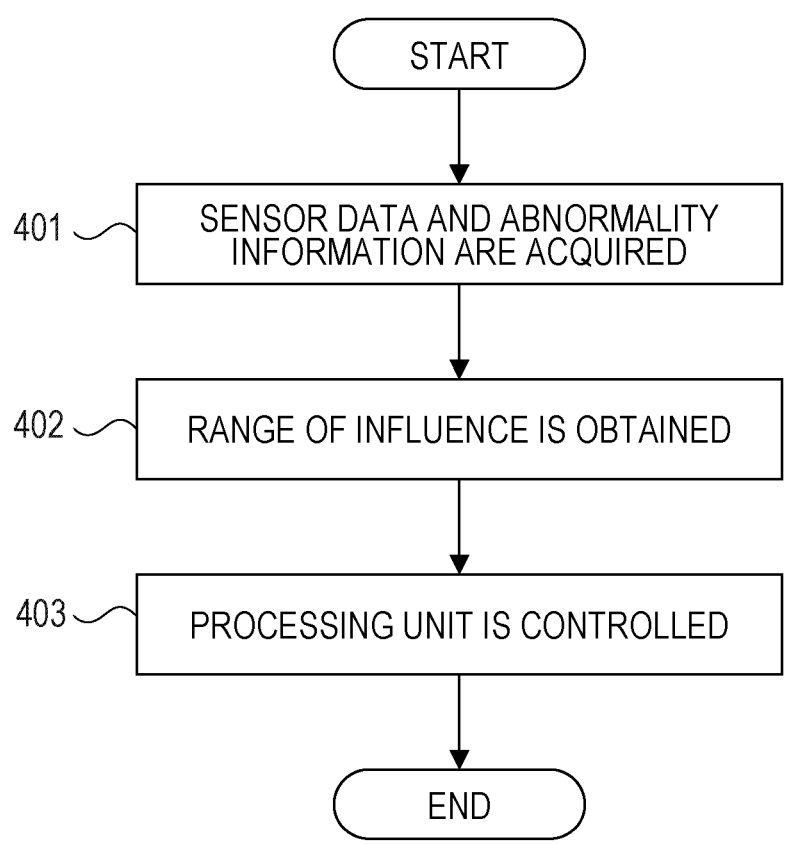
FIG. 4 is a flowchart of a control process.

FIG. 4 is a flowchart illustrating a control process performed by the control unit 312 of FIG. 3. First, the control unit 312 acquires a plurality of sensor data items output from each of a plurality of sensors arranged in the liquid cooling system and abnormality information of the liquid cooling system held by another information processing apparatus (operation 401). Then, the control unit 312 obtains a range of influence of the abnormality in the liquid cooling system of the information processing system based on the acquired plurality of sensor data items and the abnormality information (operation 402), and controls the processing unit 311 based on the range of influence (operation 403).

According to the information processing apparatus 301 of FIG. 3, in the information processing system including the plurality of the information processing apparatuses, it is possible to control the information processing apparatus according to the range of influence of the abnormality in the liquid cooling system.

Figure 5:
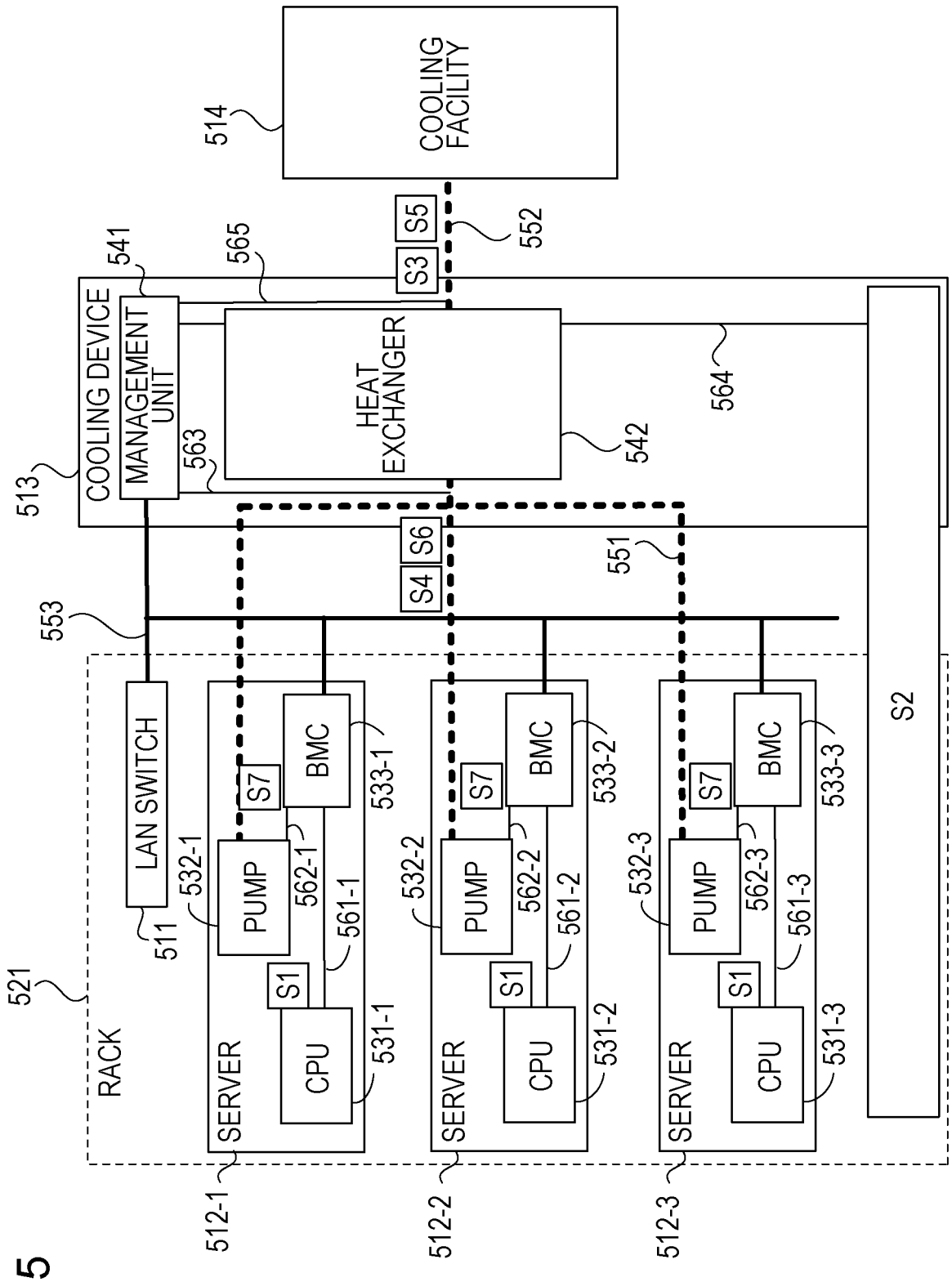
FIG. 5 is a configuration diagram of a first information processing system.

FIG. 5 illustrates a configuration example of a first information processing system including the information processing apparatus 301 of FIG. 3. The information processing system of FIG. 5 includes a local area network (LAN) switch 511, a server 512-1 to a server 512-3, and a cooling device 513. A LAN switch 511 and the server 512-1 to the server 512-3 are accommodated in a rack 521. A cooling facility 514 is a cooling tower, a chiller, or the like provided outside the information processing system.

The number of the servers 512-$i$ ($i$=1 to 3) included in the information processing system is not limited to three, and may be four or more.

The server 512-$i$ corresponds to the information processing apparatus 301 of FIG. 3, includes a CPU 531-$i$, a pump 532-*i*, and a BMC 533-*i*. The CPU 531-*i* corresponds to the processing unit 311, and performs the information process according to purpose of the information processing system. The processing unit 311 may include a memory, an HDD, or the like which is not illustrated in addition to the CPU 531-*i*. The BMC 533-*i* corresponds to the control unit 312, performs management and monitoring of the server 512-*i*, and controls an operation thereof.

A temperature sensor S1 for measuring a temperature of the CPU 531-*i* is provided in the vicinity of the CPU 531-*i*, and a rotation speed sensor S7 for measuring a rotation speed of the pump 532-*i* is provided in the vicinity of the pump 532-*i*. The temperature sensor S1 is connected to the BMC 533-*i* by a signal line 561-*i* of inter-integrated circuit (I2C) communication, and the rotation speed sensor S7 is connected to the BMC 533-*i* by a signal line 562-*i* of I2C communication.

The BMC 533-*i* acquires the sensor data output from the temperature sensor S1 and the rotation speed sensor S7 via the signal line 561-*i* and the signal line 562-*i*, and stores the acquired sensor data in a memory in the BMC 533-*i*.

The cooling device 513 includes a management unit 541 and a heat exchanger 542. In a pipe 551 disposed between each of the server 512-1 to the server 512-3 and the heat exchanger 542, the secondary side cooling water is circulated, and in a pipe 552 disposed between the heat exchanger 542 and the cooling facility 514, the primary side cooling water is circulated.

In the vicinity of the heat exchanger 542, a flow sensor S3, a flow sensor S4, a temperature sensor S5, and a temperature sensor S6 are provided, and a liquid leakage sensor S2 is provided in the rack 521. The flow sensor S3 measures a flow rate of a cooling water circulating in the pipe 552, and the flow sensor S4 measures the flow rate of the cooling water circulating in the pipe 551. The temperature sensor S5 measures a temperature of the cooling water circulating in the pipe 552, and the temperature sensor S6 measures a temperature of the cooling water circulating in the pipe 551. The liquid leakage sensor S2 measures the liquid leakage from the pipe 551.

The flow sensor S3 and the temperature sensor S5 is connected to the management unit 541 by a signal line 565 of the I2C communication, and the flow sensor S4 and the temperature sensor S6 are connected to the management unit 541 by a signal line 563 of the I2C communication. The liquid leakage sensor S2 is connected to the management unit 541 by a signal line 564 of the I2C communication.

The LAN switch 511, the BMC 533-1 to the BMC 533-3, and the management unit 541 are connected to each other by a LAN 553, and the LAN switch 511 controls communication between the BMC 533-1 to the BMC 533-3 and the management unit 541. The BMC 533-1 to the BMC 533-3 and the management unit 541 can communicate with each other via the LAN 553.

The management unit 541 receives the sensor data output from the flow sensor S3, the flow sensor S4, the temperature sensor S5, the temperature sensor S6, and the liquid leakage sensor S2. The BMC 533-1 to the BMC 533-3 acquires these sensor data from the management unit 541 via the LAN 553, and stores the acquired sensor data in a memory.

The cooling device 513, the cooling facility 514, the pipe 551, the pipe 552, and a sensor S1 to a sensor S7 correspond to the liquid cooling system.

FIG. 6 illustrates an example of the register R1 to the register R7 that store the sensor data acquired by each BMC 533-*i*. The register R1 to the register R7 correspond to a storage area provided in a memory of the BMC 533-*i*, and store each sensor data of the sensor S1 to the sensor S7. The sensor data of each sensor is an error flag indicating "ON" or "OFF" similar to a case of FIG. 2.

For example, in a case where the liquid leakage occurs, the temperature sensor S1, the liquid leakage sensor S2, the flow sensor S4, the temperature sensor S6, and the rotation speed sensor S7 output "ON", and the flow sensor S3 and the temperature sensor S5 output "OFF". In a case where the failure of the cooling facility occurs, the temperature sensor S1, the flow sensor S3, and the temperature sensor S5 output "ON", and the liquid leakage sensor S2, the flow sensor S4, the temperature sensor S6, and the rotation speed sensor S7 output "OFF".

In addition, in a case of the failure of the pump 532-*i*, the temperature sensor S1, the flow sensor S4, the temperature sensor S6, and the rotation speed sensor S7 output "ON", and the liquid leakage sensor S2, the flow sensor S3, and the temperature sensor S5 output "OFF". In a case where the insufficient flow in the pipe 551 occurs, the temperature sensor S1, the flow sensor S4, and the temperature sensor S6 output "ON", and the liquid leakage sensor S2, the flow sensor S3, the temperature sensor S5, and the rotation speed sensor S7 output "OFF".

Therefore, the BMC 533-*i* can specify whether anyone abnormality occurs among the liquid leakage, the failure of the cooling facility, the failure of pump, or the insufficient flow in the pipe by analyzing a combination of the sensor data of the register R1 to the register R7. The BMC 533-*i* stores the abnormality information indicating a type of the specified abnormality in a memory. In a case where the sensor data of the registers R1 to R7 indicate a pattern other than the combination illustrated in FIG. 6, the BMC 533-*i* determines that none of the abnormality has occurred.

In a case where the type of abnormality illustrated in FIG. 6 is specified, it is not significant to use all the sensor data of the register R1 to the register R7 and it is also possible to specify the type of abnormality by using a combination of the sensor data as follows.

(1) R1, R2, R3, and R7
(2) R1, R2, R5, and R7
(3) R1, R2, R4, and R7
(4) R1, R2, R6, and R7
(5) R1, R3, R4, and R7
(6) R1, R3, R6, and R7
(7) R1, R5, R4, and R7
(8) R1, R5, R6, and R7

In this case, three sensors corresponding to a combination of (1) to (8) among the sensor S2 to the sensor S7 and the temperature sensor S1 may be provided in the information processing system. Therefore, if three sensors or more among the sensor S2 to the sensor S7 and the temperature sensor S1 are provided, other sensors can be omitted.

Furthermore, each BMC 533-*i* acquires the abnormality information indicating the type of abnormality specified by the BMC 533-*j* from the BMC 533-*j* of another server 512-*j* (j≠i) via the LAN 553, stores the acquired abnormality information in a memory.

FIG. 7 illustrates an example of the register R8 to the register R11 that store position information and the abnormality information of the server. The register R8 to the register R11 correspond to a storage area provided in a memory of the BMC 533-*i*. The register R8 stores the position information of the server 512-*i* (own server) in the rack 521. As the position information in the rack 521, for example, the number (U number) of U (unit) can be used. The U number indicates a position in a height direction of the rack 521 and indicates that a position is high as the value is great. NULL means that the U number is not set. In an initial state, a value of the register R8 is set to NULL.

The register R9 stores the abnormality information indicating the type of abnormality specified by the BMC 533-$i$ within the server 512-$i$. The abnormality information has a value of NULL or 1 to 4. NULL indicates no abnormality, 1 indicates the liquid leakage, 2 indicates the failure of the cooling facility, 3 indicates the failure of pump, and 4 indicates the insufficient flow in the pipe. In the initial state, a value of the register R9 is set to NULL.

The register R10 stores the position information of another server 512-$j$ (another server) within the rack 521. A value of the position information of the register R10 is the same as a case of the register R8. The register R11 stores the abnormality information acquired from the BMC 533-$j$ of another server 512-$j$ by the BMC 533-$i$. The abnormality information of the register R11 is the same as a case of the register R9.

The BMC 533-$i$ obtains the range of influence of the abnormality in the information processing system by analyzing information stored in the register R1 to the register R11. Then, the BMC 533-$i$ determines whether or not the server 512-$i$ is stopped based on whether or not the server 512-$i$ which is a monitoring target of the BMC 533-$i$ is included in the range of influence.

Figure 8:
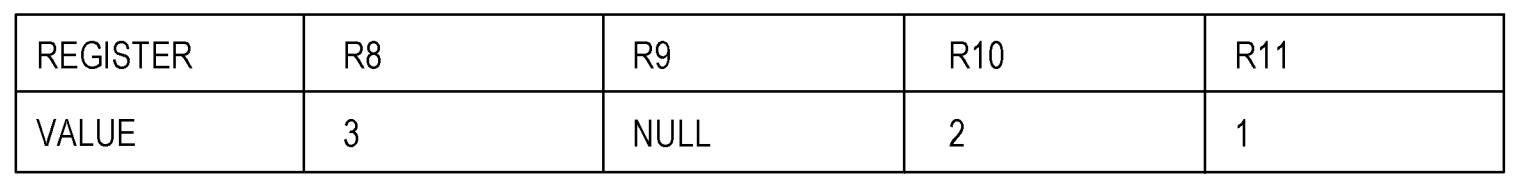

FIG. 8 illustrates an example of values of the register R8 to the register R11. Since the value of the register R9 is NULL and a value of the register R11 is 1, it can be seen that no abnormality is detected in the server 512-$i$ and the liquid leakage is detected in server 512-$j$. In addition, since the value of the register R8 is 3 and a value of the register R10 is 2, it can be seen that the server 512-$i$ is present at a position of 3U and the server 512-$j$ is present at a position of 2U.

In a case where the liquid leakage occurs in another server, when the own server is present at a position higher than a position of another server, it is considered that there is no possibility that the liquid leakage of the other servers affects the operation of the own server. Meanwhile, in a case where the own server is present at the same position as or a position lower than that of another server, it is considered that there is a possibility that the liquid leakage of the other servers affects the operation of the own server.

Therefore, the BMC 533-$i$ determines that the same position as or a position lower than a position of 2U in which the server 512-$j$ is present, is in the range of influence affected by the liquid leakage. Since the server 512-$i$ is present at a higher position than that of the server 512-$j$ in which the liquid leakage occurs, it is not included in the range of influence. Therefore, the BMC 533-$i$ determines that the server 512-$i$ is not affected from the liquid leakage, and continues the operation without stopping the operation of the server 512-$i$.

Meanwhile, in a case where the register R8 and the register R10 are not present, a position relationship between the server 512-$i$ in which the abnormality does not occur and the server 512-$j$ in which the liquid leakage occurs, is unknown. Therefore, the BMC 533-$i$ determines that the server 512-$i$ is affected from the liquid leakage, and stops the operation of the server 512-$i$.

In this manner, by providing the register R8 and the register R10 and managing the position information of the own server and the position information of another server in which the liquid leakage occurs, it is possible to continue an operation of the server that is not included in the range of influence of the liquid leakage.

Figure 9:
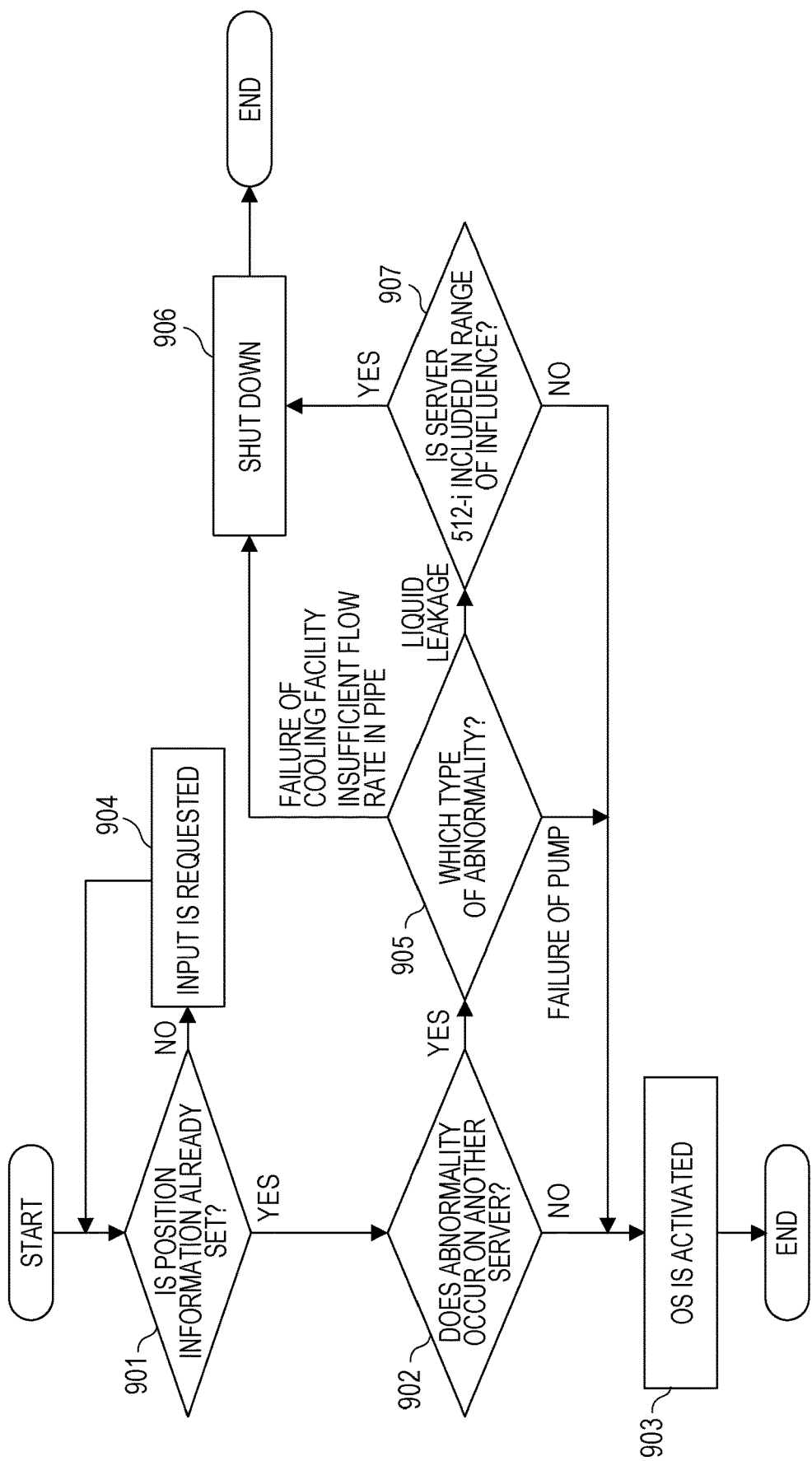
FIG. 9 is a flowchart of a first activation control process.

FIG. 9 is a flowchart illustrating an example of a first activation control process performed by the BMC 533-$i$ at the time of activation of the server 512-$i$. First, the BMC 533-$i$ checks whether or not the position information of the register R8 is already set (operation 901). In a case where the value of the register R8 is NULL, the BMC 533-$i$ determines that the position information is not set, and in a case where the value of the register R8 is a value other than the NULL, the BMC 533-$i$ determines that the position information is already set.

In a case where the position information is not set (operation 901, NO), the BMC 533-$i$ repeats processes after the operation 901 by displaying a message requesting input of the position information (operation 904). In a case where the message requesting the input of the position information is displayed on a screen, an operator inputs the position information of the server 512-$i$ to the BMC 533-$i$, and the BMC 533-$i$ writes the input position information in the register R8. For example, the operator may be a customer engineer.

In a case where the position information is already set (operation 901, YES), the BMC 533-$i$ checks whether or not any abnormality occurs in another server 512-$j$ (operation 902). At this time, the BMC 533-$i$ determines whether or not the abnormality occurs in the server 512-$j$ by inquiring whether or not an abnormality occurs with respect to the BMC 533-$j$ of each server 512-$j$.

In a case where no abnormality occurs in any of the servers 512-$j$ (operation 902, NO), the BMC 533-$i$ activates operating system (OS) of the server 512-$i$ with respect to the CPU 531-$i$ (operation 903). With this, the operation of the server 512-$i$ starts.

Meanwhile, in a case where the abnormality occurs in any of the servers 512-$j$ (operation 902, YES), the BMC 533-$i$ checks the type of abnormality occurring (operation 905). At this time, the BMC 533-$i$ acquires the value of the register R9 held by the BMC 533-$j$ of the server 512-$j$, writes the acquired result in the register R11 within a memory, and specifies the type of abnormality based on a value written in the register R11.

In a case where the type of abnormality is the failure of the cooling facility or the insufficient flow in the pipe, the BMC 533-$i$ determines that the range of influence of the abnormality is the entity of the information processing system. In this case, since the server 512-$i$ is included in the range of influence, the BMC 533-$i$ shuts down the server 512-$i$ without activating the OS (operation 906).

In a case where the type of abnormality is the failure of pump, the BMC 533-$i$ determines that the range of influence of the abnormality is not present, and performs a process of operation 903.

In a case where the type of abnormality is the liquid leakage, the BMC 533-$i$ determines that the range of influence of the abnormality is at the same position as or a position lower than that of the server 512-$j$. Then, the BMC 533-$i$ checks whether or not the server 512-$i$ is included in the range of influence (operation 907).

At this time, the BMC 533-$i$ acquires the value of the register R8 held by the BMC 533-$j$ of the server 512-$j$, writes the acquired result in the register R10 within a memory, and compares the value of the register R8 with a value of the register R10.

In a case where the value of the register R8 is equal to or less than a value of the register R10, since the server 512-$i$ is present at the same position as or a position lower than that of the server 512-$j$, it is determined that the server 512-$i$ is included in the range of influence. Meanwhile, in a case where the value of the register R8 is greater than a value of the register R10, since the server 512-*i* is present at a position higher than that of the server 512-*j*, it is determined that the server 512-*i* is not included in the range of influence.

In a case where the server 512-*i* is included in the range of influence (operation 907, YES), the BMC 533-*i* performs a process of operation 906, and in a case where the server 512-*i* is not included in the range of influence (operation 907, NO), the BMC 533-*i* performs a process of operation 903.

According to an activation control process of FIG. 9, even in a case where the abnormality occurs in the liquid cooling system of another server, if the type of abnormality is the failure of pump, it is possible to activate the own server. In addition, in a case where the type of abnormality occurring in another server is the liquid leakage, if the own server is not included in the range of influence of the liquid leakage, it is possible to activate the own server. Therefore, reduction of the number of the servers to be activated is suppressed.

Figure 10:
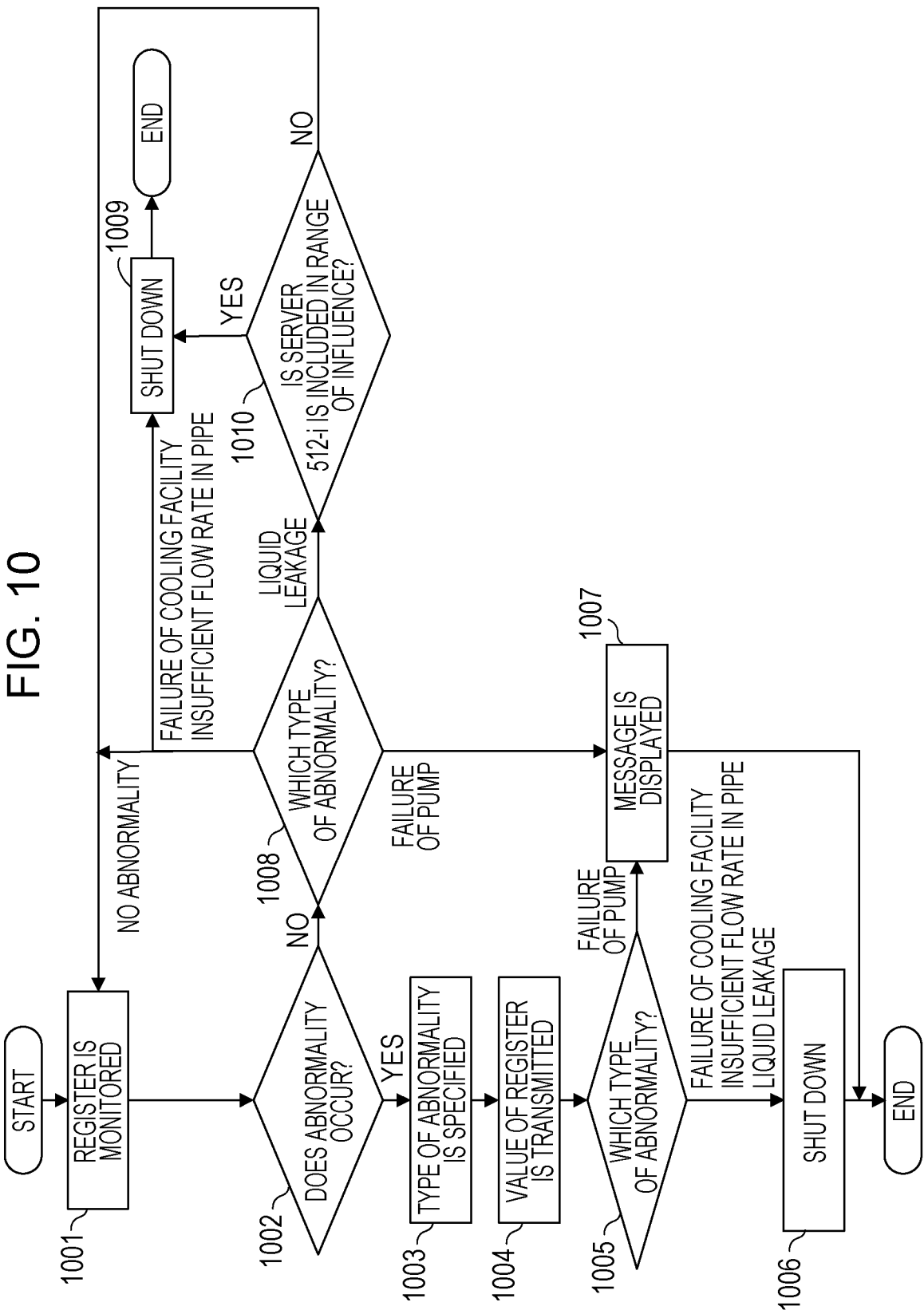
FIG. 10 is a flowchart of a first operation control process.

FIG. 10 is a flowchart illustrating an example of the first operation control process performed by the BMC 533-*i* in the operation of the server 512-*i*. First, the BMC 533-*i* monitors periodically a value of the register R1 to the register R7 (operation 1001), and checks whether or not an abnormality occurs in the server 512-*i* (operation 1002).

In a case where the abnormality occurs in the server 512-*i* (operation 1002, YES), the BMC 533-*i* specifies the type of abnormality based on values of the register R1 to the register R7, and writes the abnormality information indicating the specified abnormality in the register R9 (operation 1003). Then, the BMC 533-*i* transmits the values of the register R8 and the register R9 to the BMC 533-*j* of all the other servers 512-*j* (operation 1004).

Next, the BMC 533-*i* checks the type of abnormality based on the values written in the register R9 (operation 1005).

In a case where the type of abnormality is the failure of the cooling facility or the insufficient flow in the pipe, the BMC 533-*i* determines that the range of influence of the abnormality is the entity of the information processing system. In addition, in a case where the type of abnormality is the liquid leakage, the BMC 533-*i* determines that the range of influence of the abnormality is the same position as or a position lower than that of the server 512-*i*. In this case, since the server 512-*i* is included in the range of influence, the BMC 533-*i* shuts down the server 512-*i* with respect to the CPU 531-*i* (operation 1006). With this, the server 512-*i* disconnects a power source and the CPU 531-*i* stops an operation.

Meanwhile, in a case where the type of abnormality is the failure of pump, the BMC 533-*i* determines that the range of influence of the abnormality is not present. Then, the BMC 533-*i* displays a message indicating the failure of pump on a screen (operation 1007). In a case where the message indicating the failure of pump is displayed, the operator exchanges the pump 532-*i* for a good product.

In a case where the register R8 and the value of the register R9 is received from the BMC 533-*j* of another server 512-*j*, the BMC 533-*i* writes these values in the register R10 and the register R11 respectively.

In a case where the abnormality does not occur in the server 512-*i* (operation 1002, NO), the BMC 533-*i* writes NULL in the register R9, and checks a value of the register R11 (operation 1008).

In a case where the value of the register R11 is NULL and the abnormality does not occur in other servers 512-*j*, the BMC 533-*i* repeats processes after operation 1001. In a case where the value of the register R11 is a value other than NULL, the BMC 533-*i* specifies the type of abnormality based on the value of the register R11.

In a case where the type of abnormality is the failure of the cooling facility or the insufficient flow in the pipe, the BMC 533-*i* determines that the range of influence of the abnormality is the entity of the information processing system. In this case, since the server 512-*i* is included in the range of influence, the BMC 533-*i* shuts down the server 512-*i* with respect to the CPU 531-*i* (operation 1009). The server 512-*j* itself is shut down by the BMC 533-*j*.

In a case where the type of abnormality is the failure of pump, the BMC 533-*i* determines that the range of influence of the abnormality is not present, and performs a process of operation 1007.

In a case where the type of abnormality is the liquid leakage, the BMC 533-*i* determines that the range of influence of the abnormality is present at the same position as or a position lower than that of the server 512-*j*. Then, the BMC 533-*i* checks whether or not the server 512-*i* is included in the range of influence similar to operation 907 of FIG. 9 (operation 1010).

In a case where the server 512-*i* is included in the range of influence (operation 1010, YES), the BMC 533-*i* performs a process of operation 1009. Meanwhile, in a case where the server 512-*i* is not included in the range of influence (operation 1010, NO), the BMC 533-*i* repeats processes after operation 1001.

According to an operation control process of FIG. 10, even in a case where the abnormality occurs in the liquid cooling system of the own server or another server, if the type of abnormality is the failure of pump, it is possible to continue an operation of the own server. In addition, in a case where the type of abnormality occurring in another server is the liquid leakage, if the own server is not included in the range of influence of the liquid leakage, it is possible to continue the operation of the own server. Therefore, reduction in the number of servers that continue to provide services to end users is suppressed.

With this, the availability of the information processing system is improved and it becomes easy to apply the liquid cooling technology of the supercomputer system to the information processing system for enterprise use. In addition, by displaying the message indicating the failure of pump, the time desired for the maintenance work by the operator is reduced.

However, in an actual information processing system, the server may be installed in a plurality of racks or a plurality of servers may be installed at positions indicated by the same U number in a rack as a blade server or a multi-node server.

Figure 11:
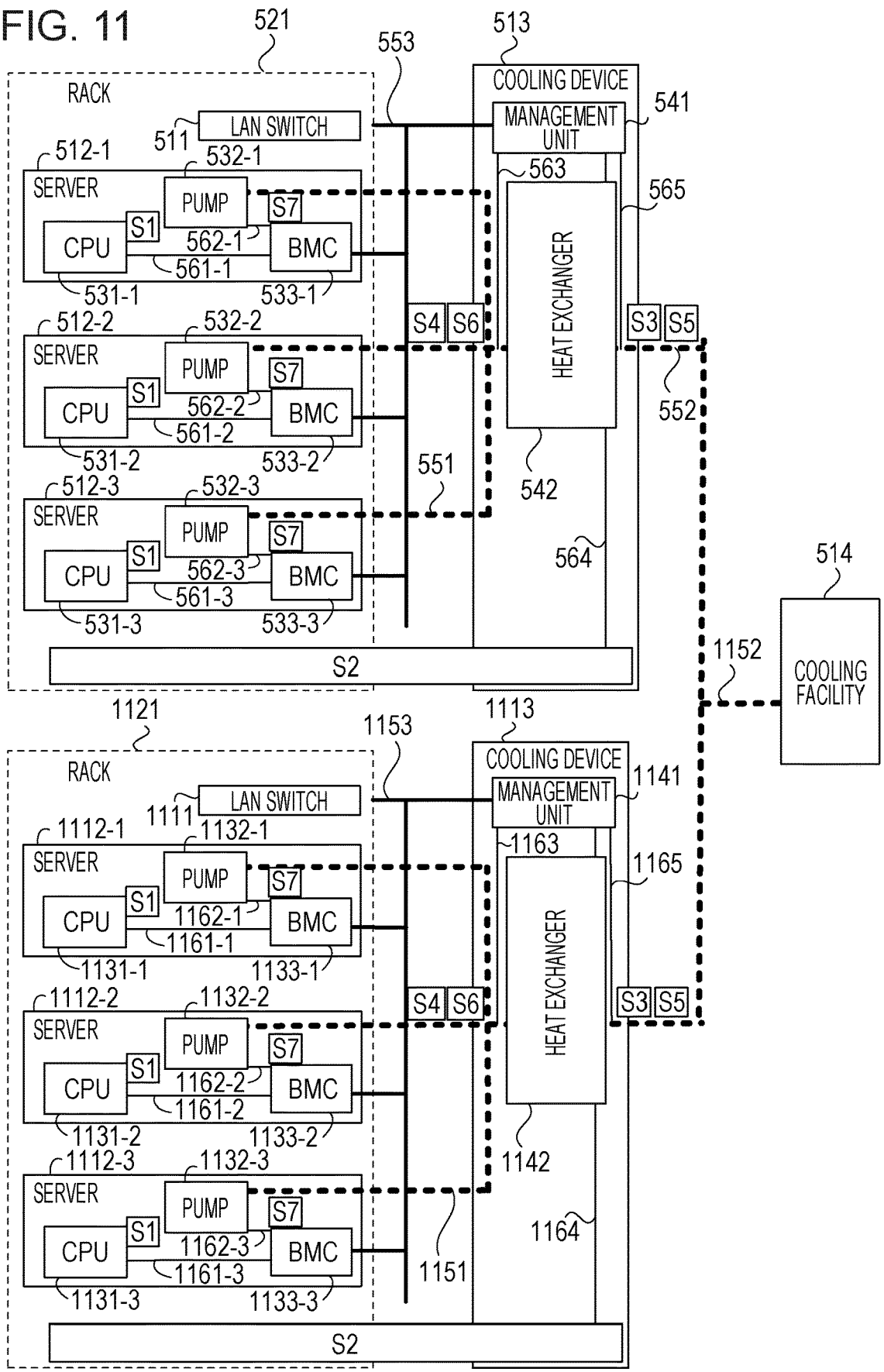
FIG. 11 is a configuration diagram of a second information processing system.

FIG. 11 illustrates a configuration example of the second information processing system including a plurality of racks. The information processing system of FIG. 11 has a configuration in which a LAN switch 1111, a server 1112-1 to a server 1112-3, and a cooling device 1113 are added to the information processing system of FIG. 5. The LAN switch 1111 and the server 1112-1 to the server 1112-3 are accommodated in a rack 1121.

The number of the servers 1112-*i* (i=1 to 3) accommodated in the rack 1121 is not limited to three, and may be equal to or greater than four.

The server 1112-*i* corresponds to the information processing apparatus 301 of FIG. 3, and includes a CPU 1131-*i*, a pump 1132-*i*, and a BMC 1133-*i*. The CPU 1131-*i* corresponds to the processing unit 311, and performs the information process according to the purpose of the information processing system. The processing unit 311 may include a memory, an HDD, or the like not illustrated, other than the CPU 1131-*i*. The BMC 1133-*i* corresponds to the control unit 312, performs management and monitoring of the server 1112-*i*, and controls an operation thereof.

the temperature sensor S1 for measuring a temperature of the CPU 1131-*i* is provided in the vicinity of the CPU 1131-*i* and the rotation speed sensor S7 for measuring the rotation speed of the pump 1132-*i* in the vicinity of the pump 1132-*i*. The temperature sensor S1 is connected to the BMC 1133-*i* by a signal line 1161-*i* of the I2C communication and the rotation speed sensor S7 is connected to the BMC 1133-*i* by a signal line 1162-*i* of the I2C communication.

The BMC 1133-*i* acquires the sensor data output from the temperature sensor S1 and the rotation speed sensor S7, and stores the acquired sensor data in a memory within the BMC 1133-*i* via the signal line 1161-*i* and the signal line 1162-*i*.

The cooling device 1113 includes a management unit 1141 and a heat exchanger 1142. In a pipe 1151 disposed between each of the server 1112-1 to the server 1112-3 and the heat exchanger 1142, the secondary side cooling water is circulated, and the primary side cooling water is circulated in the pipe 1152 disposed between the heat exchanger 1142 and the cooling facility 514.

The flow sensor S3, the flow sensor S4, the temperature sensor S5, and the temperature sensor S6 are provided in the vicinity of the heat exchanger 1142 and the liquid leakage sensor S2 is provided in the rack 1121. The flow sensor S3 measures the flow rate of the cooling water circulated in the pipe 1152, the flow sensor S4 measures the flow rate of the cooling water circulated in the pipe 1151. The temperature sensor S5 measures a temperature of the cooling water circulated in the pipe 1152, and the temperature sensor S6 measures a temperature of the cooling water circulated in the pipe 1151. The liquid leakage sensor S2 measures the liquid leakage from the pipe 1151.

The flow sensor S3 and the temperature sensor S5 is connected to the management unit 1141 by a signal line 1165 of the I2C communication and the flow sensor S4 and the temperature sensor S6 is connected to by a signal line 1163 of the I2C communication. The liquid leakage sensor S2 is connected to the management unit 1141 by a signal line 1164 of the I2C communication.

The LAN switch 1111, a BMC 1133-1 to a BMC 1133-3, and the management unit 1141 are connected to each other by a LAN 1153, and the LAN switch 1111 controls communication between the BMC 1133-1 to the BMC 1133-3 and the management unit 1141. The BMC 1133-1 to the BMC 1133-3 and the management unit 1141 can communicate with each other via a LAN 1153.

The management unit 1141 receives the sensor data output from the flow sensor S3, the flow sensor S4, the temperature sensor S5, the temperature sensor S6, and the liquid leakage sensor S2. The BMC 1133-1 to the BMC 1133-3 acquires these sensor data from the management unit 1141 via a LAN 1153, and stores the acquired sensor data in a memory.

The register R12 and the register R13 are provided in a memory of the BMC 533-*i* and the BMC 1133-*i*, in addition to the register R1 to the register R7 illustrated in FIG. 6 and the register R8 to the register R11 illustrated in FIG. 7.

FIG. 12 illustrates an example of the register R8 to the register R13. The register R12 is connected to the server 512-*i* or the server 1112-*i* (own server), and stores identification information (ID) of the heat exchanger 542 or the heat exchanger 1142. For example, as an ID of the heat exchanger 542 or the heat exchanger 1142, a serial number can be used. The ID of the heat exchanger 542 corresponds to the rack 521 and the ID of the heat exchanger 1142 corresponds to the rack 1121.

For example, in a case where a memory of the management unit 541 stores the ID of the heat exchanger 542, the BMC 533-*i* acquires the ID of the heat exchanger 542 from the management unit 541, and writes the acquired result in the register R12. Similarly, in a case where a memory of the management unit 1141 stores the ID of the heat exchanger 1142, the BMC 1133-*i* acquires the ID of the heat exchanger 1142 from the management unit 1141, and writes the acquired result in the register R12.

The register R13 stores the heat exchanger 542 or the ID of the heat exchanger 1142 connected to another server 512-*j* or another server 1112-*j* (another server). In a case where an abnormality occurs in another server, the BMC 533-*i* or the BMC 1133-*i* can determine whether or not the own server is present in the same rack as that of another server by comparing a value of the register R12 and a value of the register R13.

Figure 13:
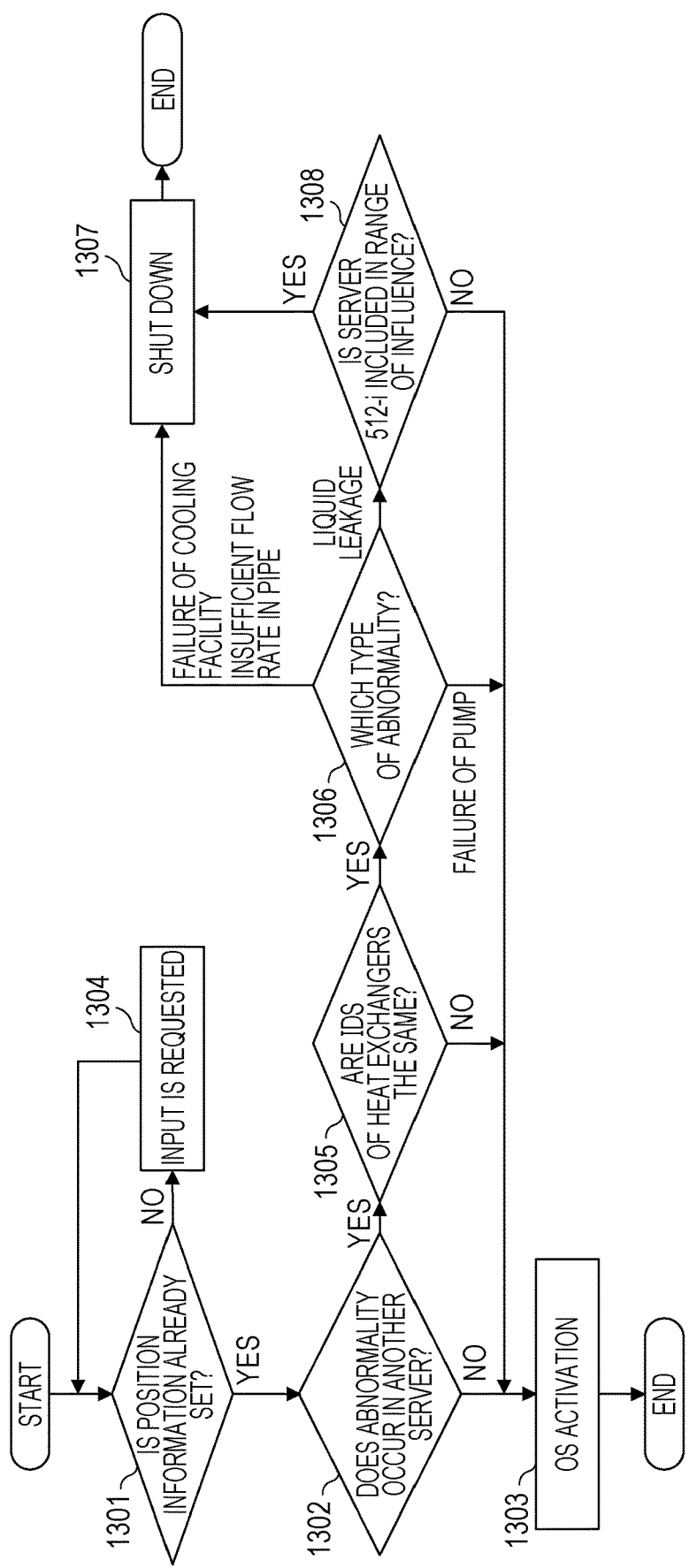
FIG. 13 is a flowchart of a second activation control process.

FIG. 13 is a flowchart illustrating an example of a second activation control process performed by the BMC 533-*i* or the BMC 1133-*i* at the time of activating the server 512-*i* or the server 1112-*i*. Hereinafter, simply, it is assumed that the server 512-*i* or the server 1112-*i* is described as the own server, the server 512-*j* or the server 1112-*j* is described as another server, the BMC 533-*i* or the BMC 1133-*i* is described as the BMC.

Processes of operation 1301 to operation 1304 and operation 1306 to operation 1308 are the same as the processes of the operation 901 to operation 907 of FIG. 9.

In a case where the abnormality occurs in one of other servers (operation 1302, YES), the BMC compares an ID of the heat exchanger connected to the own server with the ID of the heat exchanger connected to other server (operation 1305). At this time, the BMC acquires the value of the register R12 held by the BMC of other server, writes the acquired result in the register R13 within a memory, and compares the value of the register R12 with the value of the register R13.

In a case where the ID of the heat exchanger connected to the own server is different from the ID of the heat exchanger connected to another server (operation 1305, NO), the BMC determines that the own server is not present in the same rack as that of another server. Then, the BMC determines that the own server is not included in the range of influence of the abnormality and performs a process of operation 1303.

Meanwhile, in a case where the ID of the heat exchanger connected to the own server is the same as the ID of the heat exchanger connected to another server (operation 1305, YES), the BMC determines that the own server and another server are present in the same rack. Then, the BMC performs processes after operation 1306 by determining there is possibility that the own server is included in the range of influence of the abnormality.

According to an activation control process of FIG. 13, even in a case where an abnormality occurs in the liquid cooling system of another server, if the own server is present in the same rack as that of another server, it is possible to activate the own server.

Figure 14:
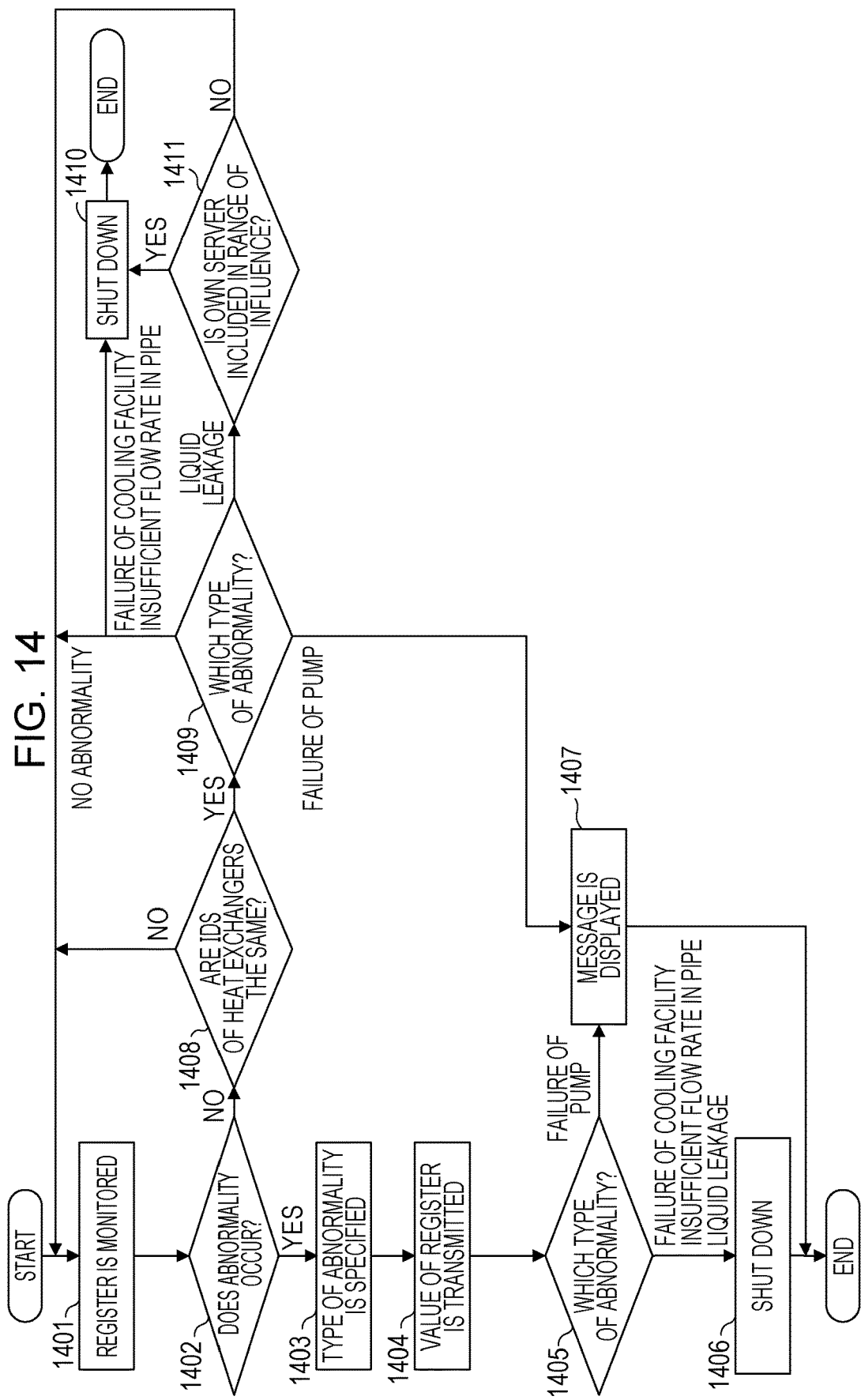
FIG. 14 is a flowchart of a second operation control process.

FIG. 14 is a flowchart illustrating an example of a second operation control process performed by the BMC 533-*i* or the BMC 1133-*i* in the operation of the server 512-*i* or the server 1112-*i*. Processes of operation 1401 to operation 1407 and operation 1409 to operation 1411 are the same as the processes of the operation 1001 to the operation 1010 of FIG. 10.

However, in operation 1404, the BMC transmits the register R8, the register R9, and the value of the register R12 to the BMC of all the other servers. Then, in a case where the values of the register R8, the register R9, and the register R12 are received from the BMC of other servers, the BMC writes each of these values in the register R10, the register R11, and the register R13.

In a case where the abnormality does not occur in the own server (operation 1402, NO), the BMC writes NULL in the register R9, and compares the own server connected to the ID of the heat exchanger with another server connected to the ID of the heat exchanger (operation 1408). At this time, the BMC compares the value of the register R12 with the value of the register R13.

In a case where the own server connected to the ID of the heat exchanger is different from another server connected to the ID of the heat exchanger (operation 1408, NO), the BMC determines that the own server is not present in the same rack as that of another server. Then, the BMC determines that the own server is not included in the range of influence of the abnormality and repeats processes after operation 1401.

Meanwhile, in a case where the own server connected to the ID of the heat exchanger is the same as another server connected to the ID of the heat exchanger (operation 1408, YES), the BMC determines that the own server is present in the same rack as that of another server. Then, the BMC performs processes after operation 1409 by determining there is a possibility that the own server is included in the range of influence of the abnormality.

According to the operation control process of FIG. 14, even in a case where the abnormality occurs in the liquid cooling system of another server, if the own server is present in the same rack as that of another server, it is possible to continue an operation of the own server.

Figure 15:
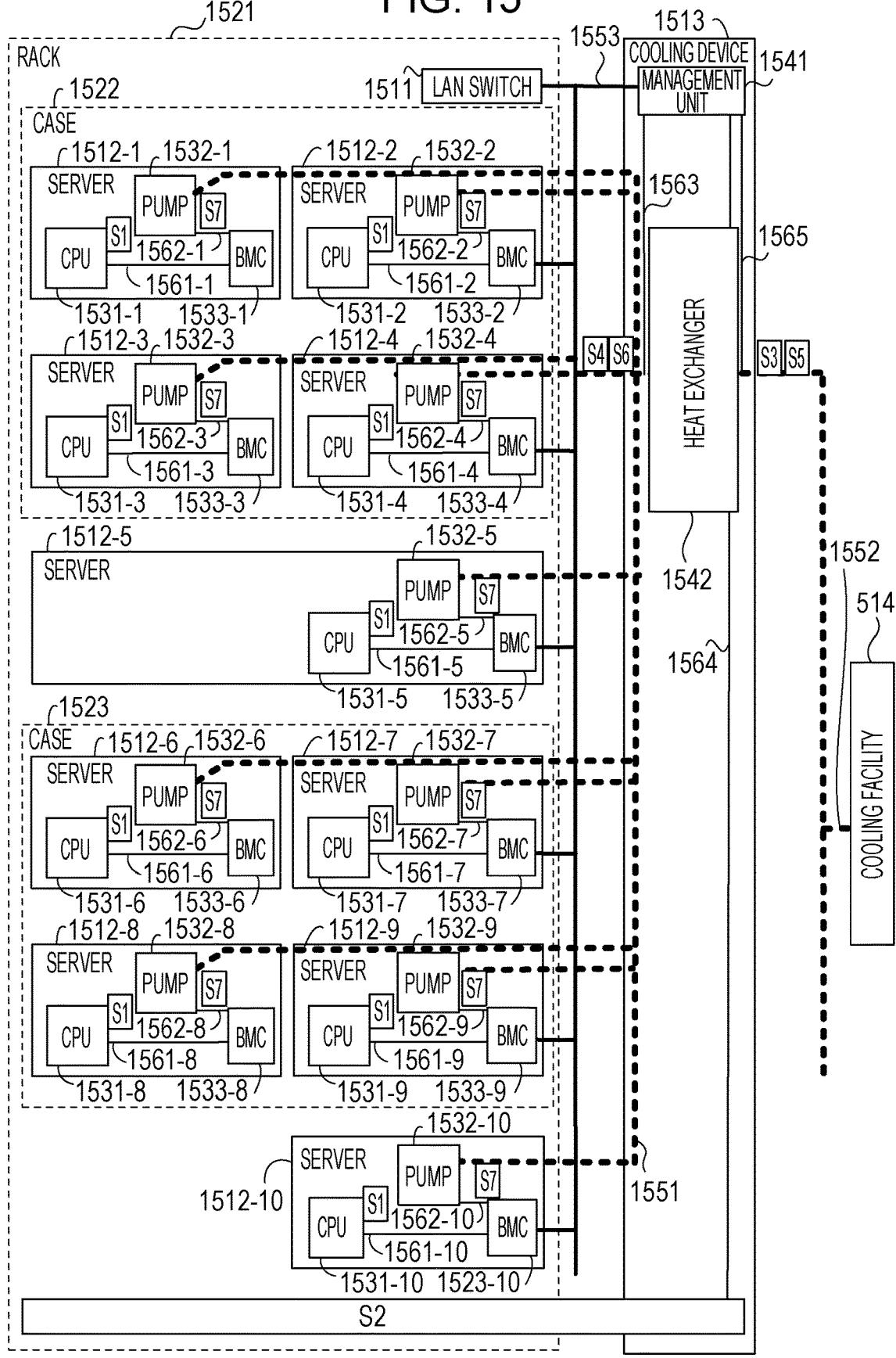
FIG. 15 is a configuration diagram of a third information processing system.

FIG. 15 illustrates a configuration example of the third information processing system on which the plurality of servers are mounted at a position in which the same U number in a rack is indicated. The information processing system of FIG. 15 includes the cooling facility 514, a LAN switch 1511, a server 1512-1 to a server 1512-10, and a cooling device 1513. The LAN switch 1511 and the server to the server 1512-10 are accommodated in a rack 1521.

Among them, the server 1512-1 to the server 1512-4 are accommodated in a case (chassis) 1522 mounted in the rack 1521, the server 1512-6 to the server 1512-9 are accommodated in a case 1523 mounted in the rack 1521. The server 1512-1 to the server 1512-4 and the server 1512-6 to the server 1512-9 correspond to a blade server or a multi-node server.

The number of the server 1512-$i$ ($i$=1 to 10) accommodated in the rack 1521 is not limited to 10 units, and may be 11 units. In addition, the number of the server 1512-$i$ accommodated in the case 1522 and the case 1523 is not limited four units, and may be five units.

The server 1512-$i$ corresponds to the information processing apparatus 301 of FIG. 3 includes a CPU 1531-$i$, a pump 1532-$i$, and a BMC 1533-$i$. The CPU 1531-$i$ corresponds to the processing unit 311, and performs the information process according to the purpose of the information processing system. The processing unit 311 may include a memory, an HDD, or the like not illustrated other than the CPU 1531-$i$. The BMC 1533-$i$ corresponds to the control unit 312, performs management and monitoring of the server 1512-$i$, and controls an operation thereof.

The temperature sensor S1 for measuring a temperature of the CPU 1531-$i$ is provided in the vicinity of the CPU 1531-$i$, and the rotation speed sensor S7 for measuring the rotation speed of the pump 1532-$i$ is provided in the vicinity of the pump 1532-$i$. The temperature sensor S1 is connected to the BMC 1533-$i$ by a signal line 1561-$i$ of the I2C communication, and the rotation speed sensor S7 is connected to the BMC 1533-$i$ by a signal line 1562-$i$ of the I2C communication.

The BMC 1533-$i$ acquires the sensor data output from the temperature sensor S1 and the rotation speed sensor S7, and stores the acquired sensor data in a memory within the BMC 1533-$i$ via the signal line 1561-$i$ and the signal line 1562-$i$.

The cooling device 1513 includes a management unit 1541 and the heat exchanger 1542. In a pipe 1551 disposed between each of the server 1512-1 to the server 1512-10 and the heat exchanger 1542, the secondary side cooling water is circulated, and in a pipe 1552 disposed between the heat exchanger 1542 and the cooling facility 514, the primary side cooling water is circulated.

The flow sensor S3, the flow sensor S4, the temperature sensor S5, and the temperature sensor S6 are provided in the vicinity of the heat exchanger 1542, and the liquid leakage sensor S2 is provided in the rack 1521. The flow sensor S3 measures the flow rate of the cooling water circulating in the pipe 1552, and the flow sensor S4 measures the flow rate of the cooling water circulating in the pipe 1551. The temperature sensor S5 measures a temperature of the cooling water circulating in the pipe 1552, and the temperature sensor S6 measures the temperature of the cooling water circulating in the pipe 1551. The liquid leakage sensor S2 measures the liquid leakage from the pipe 1551.

The flow sensor S3 and the temperature sensor S5 are connected to a management unit 1541 by a signal line 1565 of the I2C communication, and the flow sensor S4 and the temperature sensor S6 are connected to the management unit 1541 by a signal line 1563 of the I2C communication. The liquid leakage sensor S2 is connected to the management unit 1541 by a signal line 1564 of the I2C communication.

The LAN switch 1511, a BMC 1533-1 to a BMC 1533-10, and the management unit 1541 are connected to each other by a LAN 1553, the LAN switch 1511 controls communication between the BMC 1533-1 and the BMC 1533-10 and the management unit 1541. The BMC 1533-1 to the BMC 1533-10 and the management unit 1541 can communicate with each other via a LAN 1553.

The management unit 1541 receives the sensor data output from the flow sensor S3, the flow sensor S4, the temperature sensor S5, the temperature sensor S6, and the liquid leakage sensor S2. The BMC 1533-1 to the BMC 1533-10 acquires these sensor data from the management unit 1541, and stores the acquired sensor data in a memory, via a LAN 1553.

The information processing system may include the server 1512-$i$ ($i$≥11) accommodated in a rack not illustrated which is different from the rack 1521.

The register R14 and the register R15 are provided in a memory of the BMC 1533-$i$, in addition to the register R1 to the register R7 illustrated in FIG. 6 and the register R8 to the register R13 illustrated in FIG. 12.

FIG. 16 illustrates examples of the register R8 to the register R15. The register R14 stores an ID of the case 1522 or the case 1523 accommodating the server 1512-$i$ (own server). As the ID of the case 1522 or the case 1523, for example, it is possible to use the serial number.

The registers R14 of the BMC 1533-1 to the BMC 1533-4 store the ID of the case 1522 and the registers R14 of the BMC 1533-6 to the BMC 1533-9 stores the ID of the case 1523. Since the server 1512-5 is not accommodated in either the case 1522 or the case 1523, the register R14 of the BMC 1533-5 stores a pseudo ID different from that of the case 1522 and the ID of the case 1523, as an ID of an own server case. Similarly, the register R14 of the BMC 1533-10 also stores the pseudo ID.

For example, in a case where a memory device not illustrated which is provided in the case 1522 stores the ID of the case 1522, the BMC 1533-*i* (i=1 to 4) acquires the ID of the case 1522 from the memory device, and writes the acquired result in the register R14. Similarly, in a case where the memory device not illustrated which is provided in the case 1523 stores the ID of the case 1523, the BMC 1533-*i* (i=6 to 9) acquires the ID of the case 1523 from the memory device, and writes the acquired result in the register R14.

The register R15 memorizes the ID of the case 1522 or the case 1523 accommodating another server 1512-*j* (another server). In a case where another server 1512-*j* is not accommodated in either the case 1522 or the case 1523, the register R15 stores the pseudo ID.

In a case where an abnormality occurs in another server, the BMC 1533-*i* can determine whether or not the own server is present in the same case as that of another server by comparing a value of the register R14 and a value of the register R15.

Figure 17:
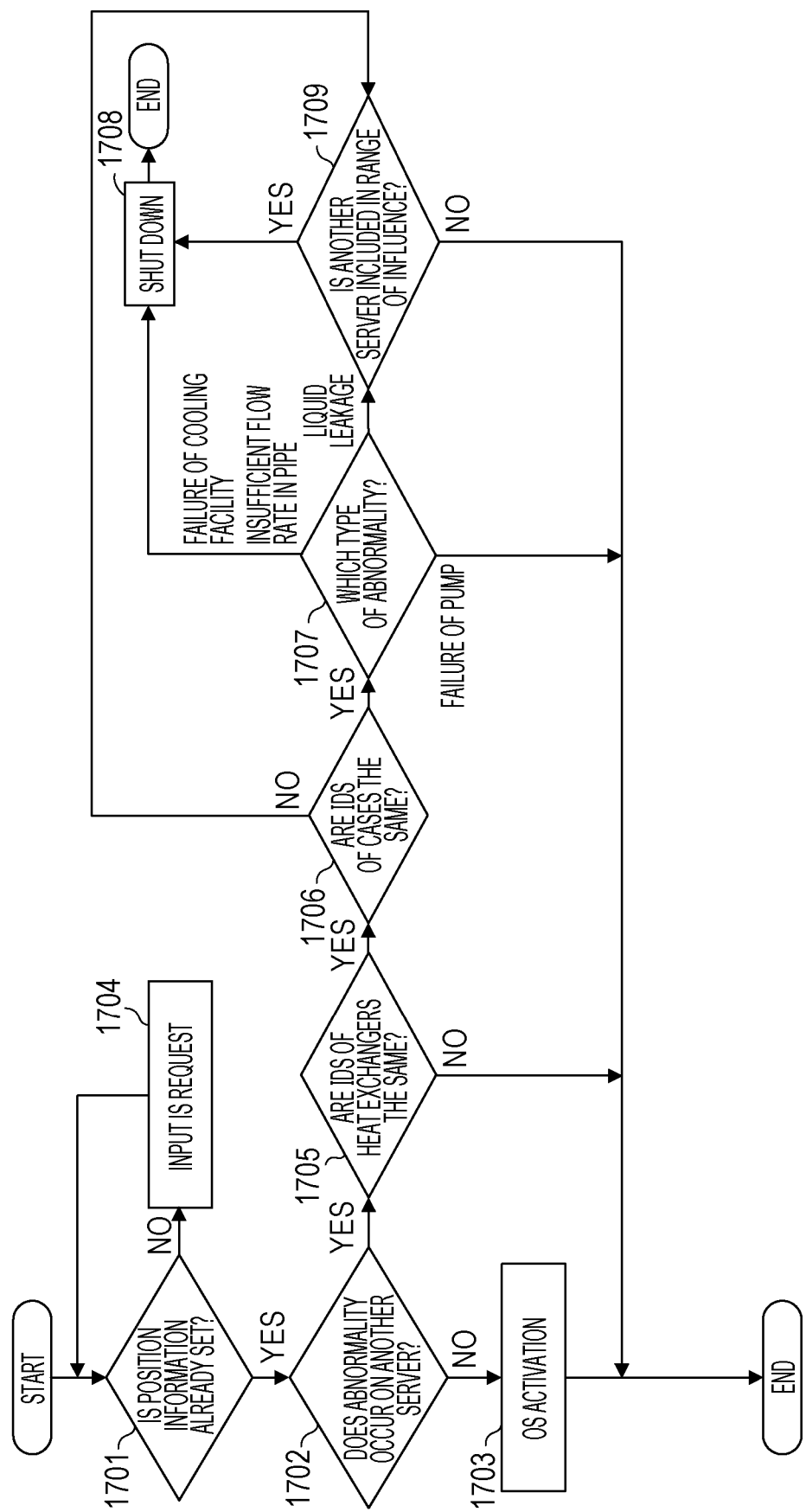
FIG. 17 is a flowchart of a third activation control process.

FIG. 17 is a flowchart illustrating an example of a third activation control process performed by the BMC 1533-*i* at the time of activation of the server 1512-*i*. Processes of operation 1701 to operation 1705 and operation 1707 to operation 1709 are the same as those of operation 1301 to operation 1308 of FIG. 13.

In a case where the server 1512-*i* connected to the ID of the heat exchanger and another server 1512-*j* connected to the ID of the heat exchanger are the same (operation 1705, YES), the BMC 1533-*i* performs a process of operation 1706. In operation 1706, the BMC 1533-*i* compares an ID of a case of the server 1512-*i* with an ID of a case of the server 1512-*j*. At this time, the BMC 1533-*i* acquires a value of the register R14 held by the BMC 1533-*j* of the server 1512-*j*, writes the acquired result in the register R15 within a memory, and compares the value of the register R14 with the value of the register R15.

In a case where the ID of the case of the server 1512-*i* and the ID of the case of the server 1512-*j* are the same (operation 1706, YES), the BMC 1533-*i* determines that the server 1512-*i* is present in the same case as that of the server 1512-*j*. Then, the BMC 1533-*i* performs processes after operation 1707.

Meanwhile, in a case where the ID of the case of the server 1512-*i* is different from the ID of the case of the server 1512-*j* (operation 1706, NO), the BMC 1533-*i* determines that the server 1512-*i* is not present in the same case as that of the server 1512-*j*. Then, the BMC 1533-*i* performs processes after operation 1709.

According to the activation control process of FIG. 17, in a case where the abnormality occurs in the liquid cooling system of another server, it is possible to perform different activation determination according to whether or not the own server is present in the same case as that of another server.

Figure 18:
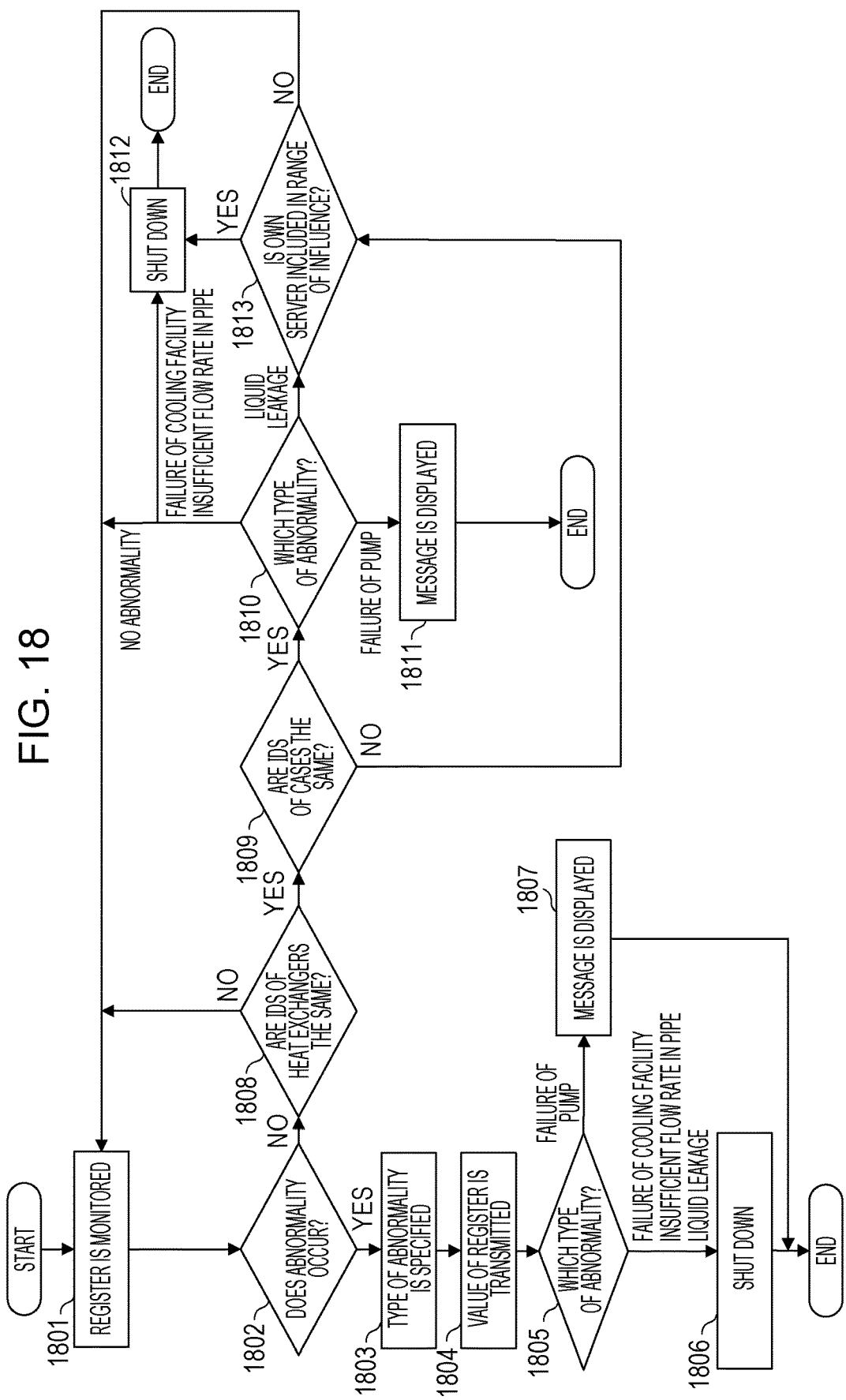
FIG. 18 is a flowchart of a third operation control process.

FIG. 18 is a flowchart illustrating an example of a third operation control process performed by the BMC 1533-*i* in the operation of the server 1512-*i*. Processes of operation 1801 to operation 1808, operation 1810, operation 1812, and operation 1813 are the same as the processes of operation 1401 to operation 1411 of FIG. 14.

However, in operation 1804, the BMC 1533-*i* transmits values of the register R8, the register R9, the register R12, and the register R14 to the BMC 1533-*j* of all the other servers 1512-*j*.

Then, in a case where values of the register R8, the register R9, the register R12, and the register R14 is received from the BMC 1533-*j* of another server 1512-*j*, the BMC 1533-*i* writes these values in a memory. In this case, the BMC 1533-*i* writes the values of the register R8, the register R9, the register R12, and the register R14 in the register R10, the register R11, the register R13, and the register R15, respectively.

In a case where the server 1512-*i* connected to the ID of the heat exchanger is the same as another server 1512-*j* connected to the ID of the heat exchanger (operation 1808, YES), the BMC 1533-*i* performs a process of operation 1809. In operation 1809, the BMC 1533-*i* compares the ID of the case of the server 1512-*i* with the ID of the case of the server 1512-*j*. At this time, the BMC compares the value of the register R14 with the value of the register R15.

In a case where the ID of the case of the server 1512-*i* and the ID of the case of the server 1512-*j* are the same (operation 1809, YES), the BMC 1533-*i* determines that the server 1512-*i* is present in the same case as that of the server 1512-*j*. Then, the BMC 1533-*i* performs processes after operation 1810. In a case where the type of abnormality is the failure of pump in operation 1810, the BMC 1533-*i* displays the message indicating the failure of pump on a screen (operation 1811).

Meanwhile, in a case where the ID of the case of the server 1512-*i* is different from the ID of the case of the server 1512-*j* (operation 1809, NO), the BMC 1533-*i* determines that the server 1512-*i* is not present in the same case as that of the server 1512-*j*. Then, the BMC 1533-*i* performs processes after operation 1813.

According to the operation control process of FIG. 18, in a case where the abnormality occurs in the liquid cooling system of another server, it is possible to perform different operation determination according to whether or not the own server is present at the same case as that of another server.

In a case where an abnormality occurs the plurality of servers 1512-*i* of the information processing system of FIG. 15, there is a possibility that values of the register R10, the register R11, the register R13, and the register R15 of FIG. 16 are overwritten according to the last detected abnormality. Therefore, whether or not to activate the server 1512-*i* or whether or not to continue the operation of the server 1512-*i* depending on the type of the occurred abnormality, may not be appropriately determined.

In a case where the abnormality occurs in the plurality of servers 1512-*i* by providing a priority table in which a priority is set according to the type of abnormality, a process in which writing of information relating to the abnormality in the register is determined based on the priority is added.

FIG. 19 illustrates an example of the priority table provided in a memory of the BMC 1533-*i*. In this case, the priority is set from the viewpoint of the possibility of being affected by an abnormality occurred in other servers. As the priority is high abnormality, there is a high possibility that the own server is affected.

The abnormality of the priority 1 is the failure of the cooling facility and corresponding abnormality information is "2". Since the failure of the cooling facility affects all the servers 1512-*i* in the information processing system, the highest priority is set.

The abnormality of the priority 2 is the insufficient flow in the pipe and corresponding abnormality information is "4". Since the range of influence of the insufficient flow in the pipe in another server is changed by an occurrence position of the abnormality, the priority lower than that of the failure of the cooling facility is set.

The abnormality of the priority 3 is the liquid leakage and corresponding abnormality information is "1". Since the range of influence of the liquid leakage in another server is also changed by the occurrence position of the abnormality, the priority lower than that of the failure of the cooling facility is set.

The abnormality of the priority 4 is the failure of pump and corresponding abnormality information is "3". Since the failure of pump in another server affects the own server, the lowest priority is set.

In a case where a plurality of abnormalities occur in another server, the BMC 1533-$i$ can select the abnormality of the highest priority and write information relating to the selected abnormality in a register based on the priority set in the priority table.

Figure 20:
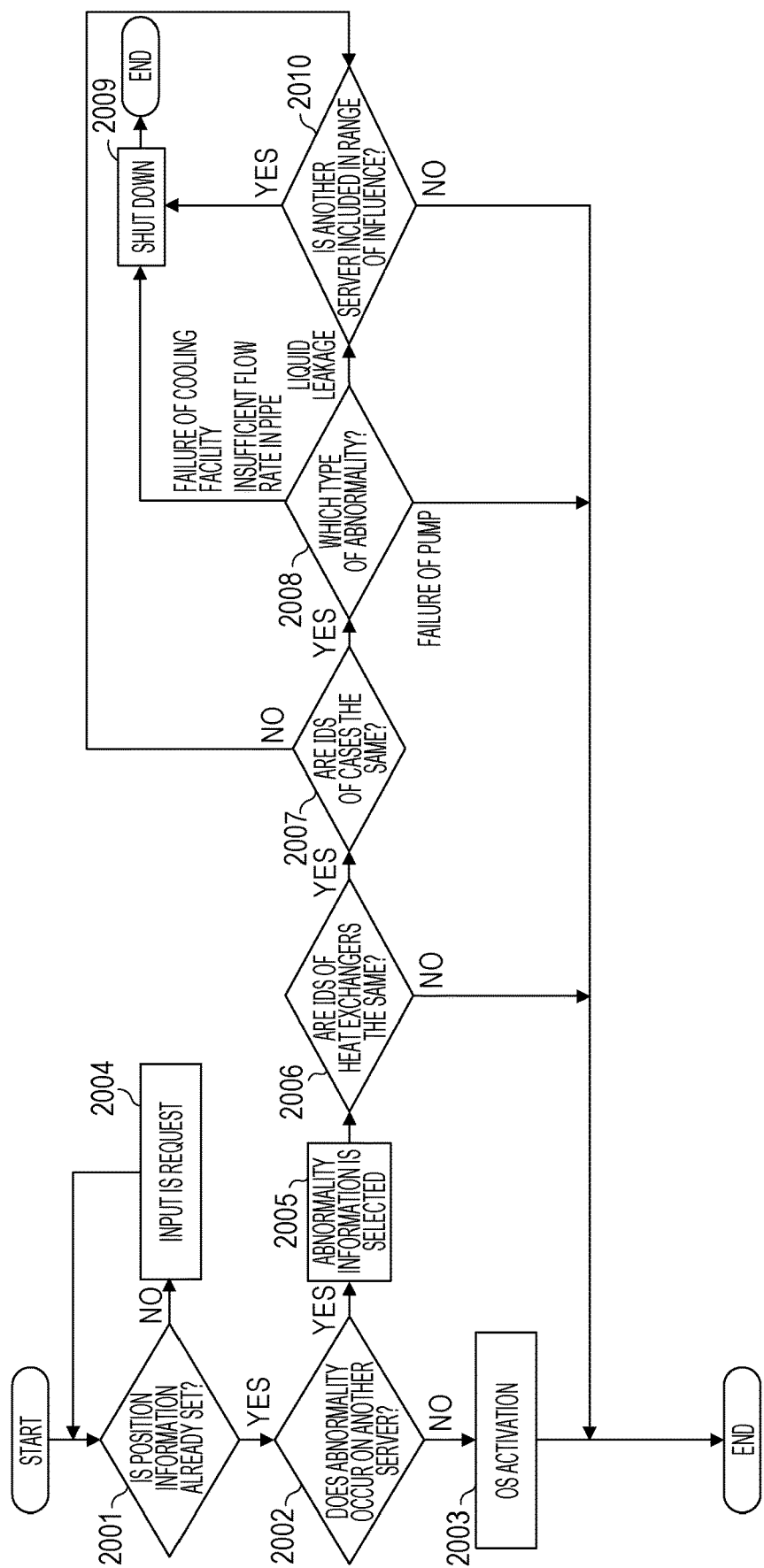
FIG. 20 is a flowchart of a fourth activation control process.

FIG. 20 is a flowchart illustrating an example of a fourth activation control process performed by the BMC 1533-$i$ at the time of activation of the server 1512-$i$. Processes of operation 2001 to operation 2004 and operation 2006 to operation 2010 are the same as the processes of operation 1701 to operation 1709 of FIG. 17.

In a case where the abnormality occurs in another server 1512-$j$ (operation 2002, YES), the BMC 1533-$i$ performs a process of operation 2005. In operation 2005, the BMC 1533-$i$ acquires the values of the register R8, the register R9, the register R12, and the register R14 from all the server 1512-$j$ from which the abnormality occurs. Then, the BMC 1533-$i$ selects the abnormality information of the highest priority among the abnormality information of a plurality of the registers R9 with reference to the priority table.

Next, the BMC 1533-$i$ writes the values of the register R8, the register R9, the register R12, and the register R14 of the server 1512-$j$ from which the selected abnormality information is transmitted in each of the register R10, the register R11, the register R13, and the register R15. In a case where a plurality of pieces of the abnormality information of the highest priority are present, the BMC 1533-$i$ selects the abnormality information according to the following selection criteria.
  (a) The BMC 1533-$i$ compares the values of the register R8 corresponding to a plurality of pieces of the abnormality information, and preferentially selects the abnormality information of the server 1512-$j$ presenting at a higher position.
  (b) The BMC 1533-$i$ compares the values of the register R12 corresponding to a plurality of pieces of the abnormality information, and preferentially selects the abnormality information of the server 1512-$j$ connected to the heat exchanger which is the same as the server 1512-$i$.
  (c) The BMC 1533-$i$ compares the values of the register R14 corresponding to the plurality of pieces of the abnormality information, and preferentially selects the abnormality information of the server 1512-$j$ presenting in the same case as that of the server 1512-$i$.

In a case where the abnormality occurs in a server 1512-$j$, the abnormality information of the server 1512-$j$ is selected.

The BMC 1533-$i$ performs processes after operation 2006 after completion of writing with respect to the register R10, the register R11, the register R13, and the register R15.

According to the activation control process of FIG. 20, in a case where the abnormality occurs in the liquid cooling system of a plurality of other servers, it is possible to determine information to be written in the register R10, the register R11, the register R13, and the register R15 based on the priority table. With this, it is possible to appropriately determine whether or not the server 1512-$i$ is activated.

Figure 21:
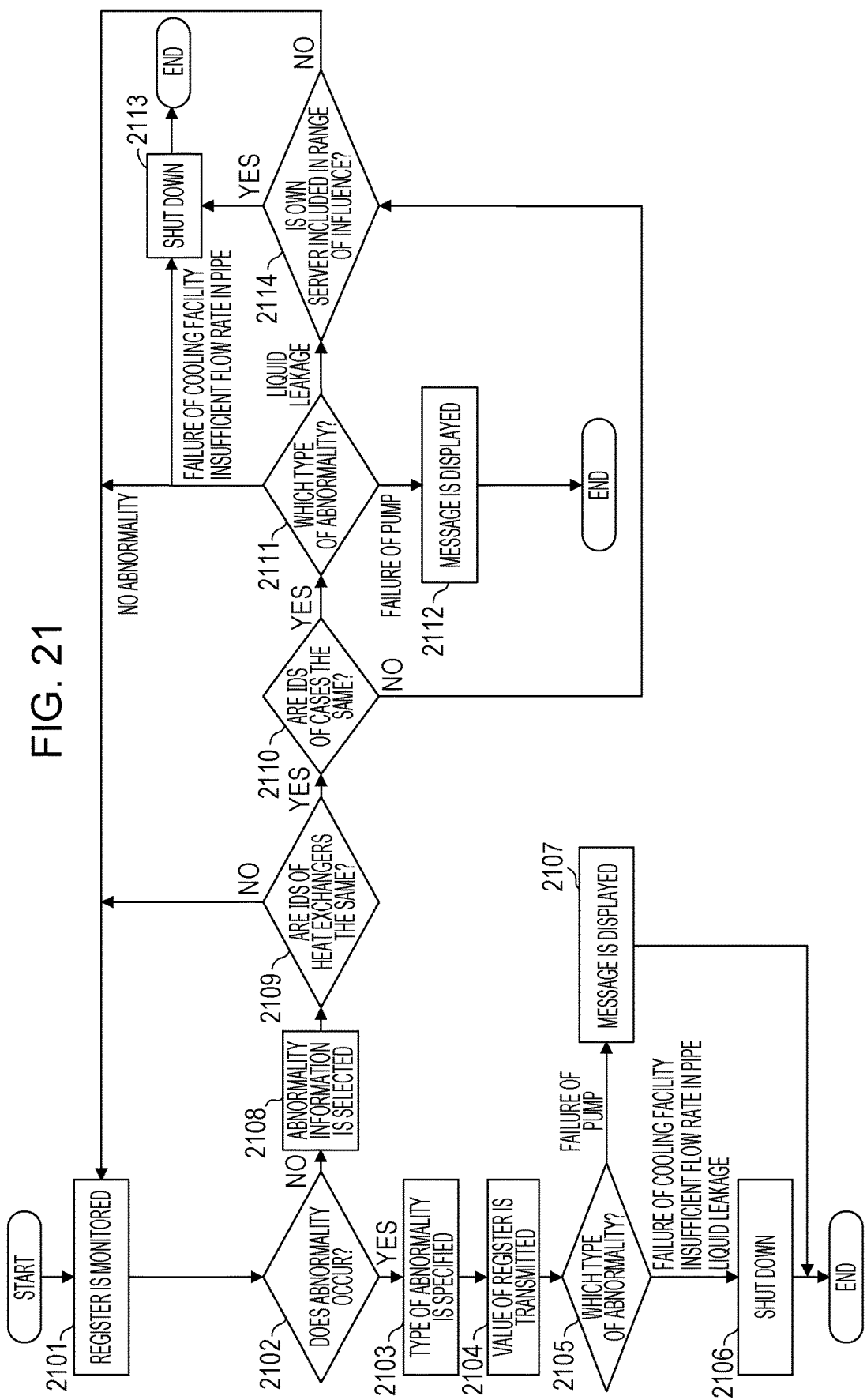
FIG. 21 is a flowchart of a fourth operation control process.

FIG. 21 is a flowchart illustrating an example of a fourth operation control process performed by the BMC 1533-$i$ in the operation of the server 1512-$i$. Processes of operation 2101 to operation 2107 and operation 2109 to operation 2114 are the same as processes of operation 1801 to operation 1813 of FIG. 18.

In a case where the abnormality does not occur in the server 1512-$i$ (operation 2102, NO), the BMC 1533-$i$ performs a process of operation 2108. In operation 2108, the BMC 1533-$i$ compares the values of the register R8, the register R9, the register R12, and the register R14 received from all the server 1512-$j$ in which the abnormality occurs. Then, the BMC 1533-$i$ selects the abnormality information of the highest priority among the abnormality information of the plurality of the registers R9 similar to the operation 2005 of FIG. 20.

Next, the BMC 1533-$i$ writes the values of the register R8, the register R9, the register R12, and the register R14 of the server 1512-$j$ in which the selected abnormality information is transmitted, in the register R10, the register R11, the register R13, and the register R15, respectively. Then, the BMC 1533-$i$ performs processes after operation 2109.

According to an operation control process of FIG. 21, in a case where the abnormality occurs in the liquid cooling system of the plurality of other servers, it is possible to determine information to be written in the register R10, the register R11, the register R13, and the register R15 based on the priority table. With this, it is possible to appropriately determine whether or not the operation of the server 1512-$i$ is continued.

Figure 1:
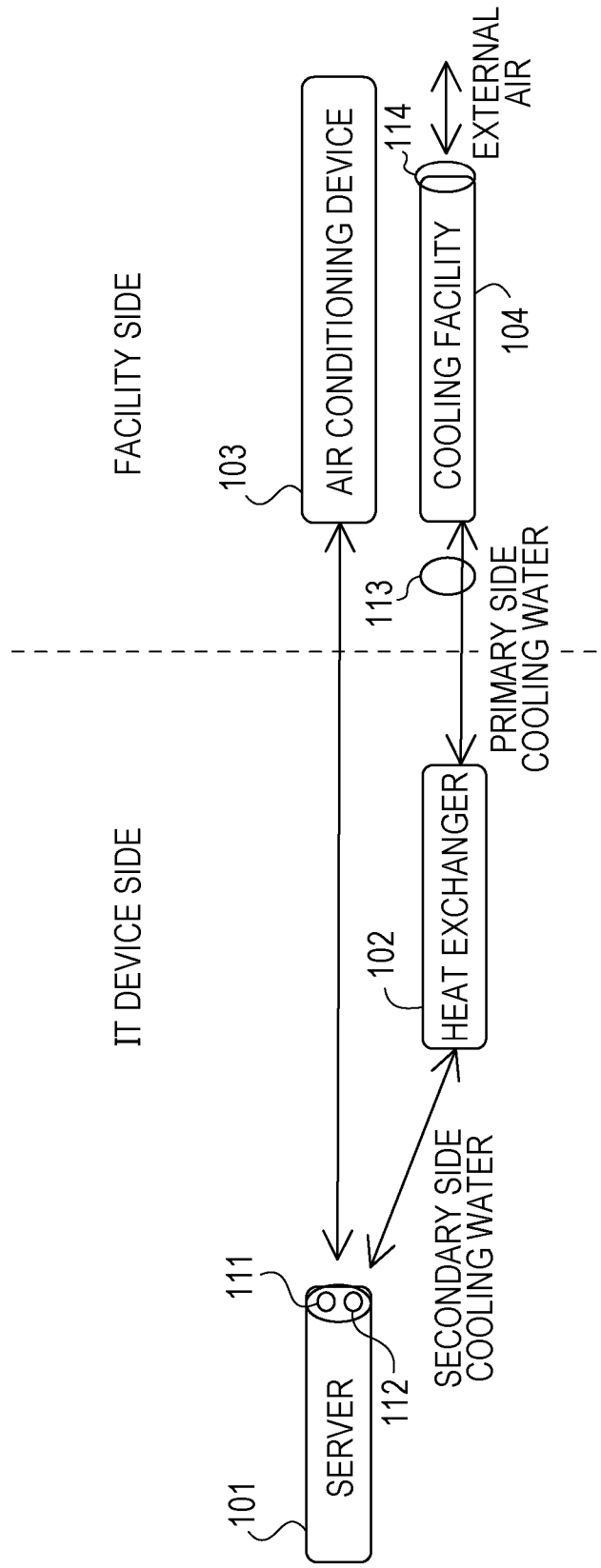
FIG. 1 is a diagram illustrating a cooling system.

The cooling system of FIG. 1 is only an example, some configuration elements may be omitted or changed according to the purpose and the condition of the cooling system. For example, instead of the cooling water, a CPU, a memory, or the like of the server 101 may be cooled by using another liquid.

A configuration of the information processing apparatus 301 of FIG. 3 is only an example, some configuration elements may be omitted or changed according to the purpose and the condition of the information processing apparatus 301.

The configuration of the information processing system in FIG. 5, FIG. 11, and FIG. 15 is only an example, some configuration elements may be omitted or changed according to the purpose and the condition of the information processing system. For example, it is possible to provide the sensor S1 to the sensor S7 at positions different from the positions illustrated in FIG. 5, FIG. 11, and FIG. 15. Some sensors among the sensor S1 to the sensor S7 may be omitted. The number and arrangement of pipes of the liquid cooling system is changed according to the purpose and the condition of the information processing system.

The flowchart in FIG. 4, FIG. 9, FIG. 10, FIG. 13, FIG. 14, FIG. 17, FIG. 18, FIG. 20, and FIG. 21 is only an example, some processes are changed according to the purpose and the condition of the information processing system.

The sensor data and the type of abnormality in FIG. 2 and FIG. 6 are only an example, the BMC may use different sensor data for specifying the abnormality of a different type. The registers of FIG. 7, FIG. 8, FIG. 12, and FIG. 16 is only an example, the BMC may obtain the range of influence of the abnormality by using a register for storing different information. The priority table of FIG. 19 is only an example, different priority may be provided with respect to each abnormality information.

Figure 22:
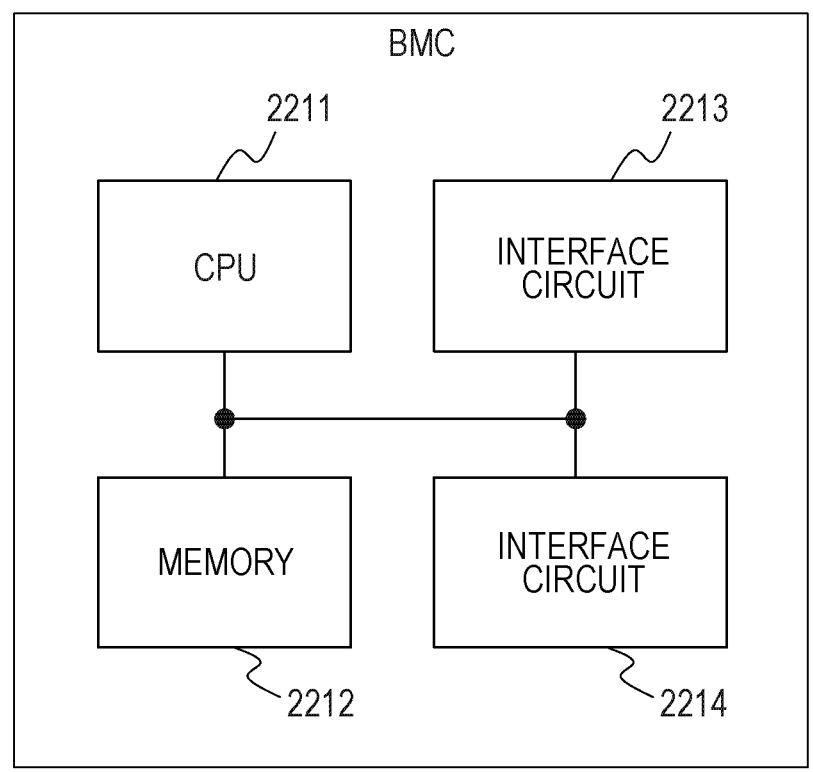
FIG. 22 is a configuration diagram of a BMC.

FIG. 22 illustrates a configuration example of the information processing apparatus (computer) using the BMC 533-*i* of FIG. 5 and FIG. 11, the BMC 1133-*i* of FIG. 11, and the BMC 1533-*i* of FIG. 15. A BMC 2201 of FIG. 22 includes a CPU 2211, a memory 2212, an interface circuit 2213, and an interface circuit 2214.

For example, the memory 2212 a semiconductor memory such as a read-only memory (ROM), a random access memory (RAM), and a flash memory, and stores a program and data used in a process. It is possible to use the memory 2212 as the register R1 to the register R7 of FIG. 6, the register R8 to the register R11 of FIG. 7, the register R12 and the register R13 of FIG. 12, and the register R14 and the register R15 of FIG. 16. The memory 2212 can store the priority table of FIG. 19.

For example, the CPU 2211 (processor) causes to execute a program by using the memory 2212, performs the management and monitoring of the server, and performs the activation control process and the operation control process. The CPU 2211 also operates as the control unit 312 of FIG. 3 by executing a program by using the memory 2212.

An operator or a user can store programs and data in a portable recording medium (not illustrated), and use them by loading them in the memory 2212. As the portable recording medium, a memory device, a flexible disk, an optical disk, a magneto-optical disk, or the like is used. The portable recording medium may be a compact disk read-only memory (CD-ROM), a digital versatile disk (DVD), a Universal Serial Bus (USB) memory, or the like.

As described above, a computer-readable recording medium that stores the program and data used for processing is a physical (non-transitory) recording medium such as the memory 2212 and the portable recording medium.

The interface circuit 2213 is connected to a LAN, and communicates with the management unit of the cooling device or another BMC. The BMC 2201 receives a program and data from external device via the interface circuit 2213, and the program and data can be loaded and used in the memory 2212. The interface circuit 2214 is connected to the signal line of the I2C communication, and communicates with the sensor S1 and the sensor S7.

A configuration of the BMC 2201 of FIG. 22 is an example, and some configuration elements may be omitted or changed according to the purpose and the condition of the information processing system.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus among a plurality of information processing apparatuses included within an information processing system, the information processing apparatus comprising:
   a memory;
   a processor coupled to the memory and configured to perform information processing; and
   a controller configured to:
   acquire a plurality of sensor data items output from each of a plurality of sensors arranged in a liquid cooling system cooling the plurality of information processing apparatuses and abnormality information relating to the liquid cooling system stored by another information processing apparatus among the plurality of information processing apparatuses;
   detect an abnormality of the liquid cooling system based on the acquired sensor data items and the abnormality information;
   obtain a range of influence of the detected abnormality of the liquid cooling system based on the detected abnormality;
   control the information processing apparatus based on the range of influence;
   determine the information processing apparatus is included within the range of influence, in a case where the plurality of sensor data items indicate failure of a cooling facility connected via a plurality of pipes and a heat exchanger to each of the plurality of information processing apparatuses, insufficient flow in a pipe disposed in the information processing apparatus among the plurality of pipes, or liquid leakage from any pipe of the plurality of pipes; and
   compare a first position in which the information processing apparatus is arranged, with a second position in which another information processing apparatus is arranged, in a case where the abnormality information indicates the liquid leakage,
   the determining determines the information processing apparatus is included within the range of influence in a case where the first position is lower than the second position.

2. The information processing apparatus according to claim 1, wherein the controller is configured to determine the information processing apparatus is included in the range of influence in a case where the abnormality information indicates the failure of the cooling facility, or the insufficient flow in the pipe arranged in another information processing apparatus among the plurality of pipes.

3. The information processing apparatus according to claim 1, wherein the plurality of sensors include
   at least three sensors, each of the at least three sensors being one of a liquid leakage sensor for measuring the liquid leakage, a first flow rate sensor for measuring a flow rate between the heat exchanger and the cooling facility, a second flow rate sensor for measuring the flow rate between the information processing apparatus and the heat exchanger, a first temperature sensor for measuring a temperature of liquid between the heat exchanger and the cooling facility, a second temperature sensor for measuring a temperature of liquid between the information processing apparatus and the heat exchanger, and a rotation speed sensor for measuring rotation speed of a pump provided in a pipe disposed in the information processing apparatus, and a third temperature sensor for measuring a temperature of a point at which the information processing is performed.

4. The information processing apparatus according to claim 1, wherein the controller is configured to stop the processor from performing the information processing, in a case where the information processing apparatus is included within the range of influence.

5. An information processing system comprising:
   a plurality of servers configured to perform information processing, each of the plurality of servers including a processor and a controller; and
   a liquid cooling system configured to cool the plurality of servers, the liquid cooling system includes a plurality of pumps respectively corresponding to the plurality of servers, at least one pipe connecting the pumps to a cooling device and a plurality of sensors, the controller of a first server of the plurality of servers is configured to:

acquire sensor data obtained by the plurality of sensors of the liquid cooling system;

acquire abnormality information from a second server of the plurality of servers;

detect an abnormality based on the acquired sensor data and abnormality information;

determine a range of influence of the detected abnormality;

stop operation of at least one of the plurality of servers based on the range of influence of the detected abnormality;

determine the first server is included within the range of influence, in a case where the plurality of sensor data items indicate failure of a cooling facility connected via a plurality of pipes and a heat exchanger to each of the plurality of servers, insufficient flow in a pipe disposed in the first server among the plurality of pipes, or liquid leakage from any pipe of the plurality of pipes; and compare a first position in which the first server is arranged, with a second position in which the second server is arranged, in a case where the abnormality information indicates the liquid leakage, the determining determines the first server is included within the range of influence in a case where the first position is lower than the second position.

6. The information processing system according to claim 5, wherein the controller is configured to determine the first server is included in the range of influence in a case where the abnormality information indicates the failure of the cooling facility, or the insufficient flow in the pipe arranged in the second server among the plurality of pipes.

7. A non-transitory computer-readable recording medium storing a program that causes a computer to execute a procedure of an information processing apparatus among a plurality of information processing apparatuses included in an information processing system, the procedure comprising:

acquiring, by a controller of the information processing apparatus, a plurality of sensor data items output from each a plurality of sensors arranged in a liquid cooling system cooling the plurality of information processing apparatuses and abnormality information of the liquid cooling system stored by another information processing apparatus among the plurality of the information processing apparatuses;

detecting an abnormality of the liquid cooling system based on the acquired sensor data items and the abnormality information;

obtaining a range of influence of the detected abnormality of the liquid cooling system based on the detected abnormality, performing, by a processor of the information processing apparatus, an information process based on the range of influence;

determining the information processing apparatus is included within the range of influence, in a case where the plurality of sensor data items indicate failure of a cooling facility connected via a plurality of pipes and a heat exchanger to each of the plurality of the information processing apparatuses, insufficient flow in a pipe disposed in the information processing apparatus among the plurality of pipes, or liquid leakage from any pipe of the plurality of pipes; and comparing a first position in which the information processing apparatus is arranged, with a second position in which another information processing apparatus is arranged, in a case where the abnormality information indicates the liquid leakage, the determining determines the information processing apparatus is included within the range of influence in a case where the first position is lower than the second position.

8. The non-transitory computer-readable recording medium according to claim 7, wherein the procedure further comprises:

determining the information processing apparatus is included in the range of influence in a case where the abnormality information indicates the failure of the cooling facility, or the insufficient flow in the pipe arranged in another information processing apparatus among the plurality of pipes.

* * * * *